(12) United States Patent
Kuramochi et al.

(10) Patent No.: US 7,755,521 B1
(45) Date of Patent: Jul. 13, 2010

(54) A-D CONVERT APPARATUS, D-A CONVERT APPARATUS AND ADJUSTMENT METHOD

(75) Inventors: Yasuhide Kuramochi, Miyagi (JP); Akira Matsuzawa, Kanagawa (JP)

(73) Assignee: Advantest Corporation, Tokyo (JP)

( * ) Notice: Subject to any disclaimer, the term of this patent is extended or adjusted under 35 U.S.C. 154(b) by 50 days.

(21) Appl. No.: 12/342,078

(22) Filed: Dec. 23, 2008

(51) Int. Cl.
*H03M 1/06* (2006.01)

(52) U.S. Cl. ...................... 341/118; 341/172

(58) Field of Classification Search ............ 341/118, 341/120, 172
See application file for complete search history.

(56) References Cited

U.S. PATENT DOCUMENTS

| | | | |
|---|---|---|---|
| 5,684,487 A * | 11/1997 | Timko | 341/172 |
| 6,448,911 B1 * | 9/2002 | Somayajula | 341/120 |
| 6,891,487 B2 * | 5/2005 | Leung et al. | 341/120 |
| 7,456,768 B2 * | 11/2008 | La Rue et al. | 341/141 |
| 2007/0132626 A1 | 6/2007 | Hurrell | |
| 2009/0184857 A1 * | 7/2009 | Furuta et al. | 341/156 |

FOREIGN PATENT DOCUMENTS

JP 03-206728 9/1991
JP 2001-024519 1/2001

OTHER PUBLICATIONS

"Search Report of PCT counterpart application", issued on Feb. 2, 2010, p. 1-p. 5.

* cited by examiner

*Primary Examiner*—Howard Williams
(74) *Attorney, Agent, or Firm*—Jianq Chyun IP Office

(57) ABSTRACT

An A/D conversion device including a first A/D conversion section and a second A/D conversion section that each include a D/A converter that has a plurality of bit capacitors corresponding to bits of input data, a comparing section that compares a reference voltage with a difference voltage obtained by subtracting an analog input voltage from an output voltage of the D/A converter, and a control section that detects a data value of the input data at which the difference voltage is substantially the same as the reference voltage and outputs the data value as digital data according to the input voltage, and an adjusting section that serially connects the bit capacitors of the D/A converter of the first A/D conversion section and the bit capacitors of the D/A converter of the second A/D conversion section that correspond to the same bits, and adjusts a capacity of at least one of the bit capacitors so that a voltage between the two bit capacitors approaches a middle point of voltages of the two bit capacitors.

11 Claims, 13 Drawing Sheets

A-D CONVERT APPARATUS, D-A CONVERT APPARATUS AND ADJUSTMENT METHOD

BACKGROUND

1. Field of the Invention

The present invention relates to an A/D conversion device, a D/A conversion device, and an adjusting method. More particularly, the present invention relates to an A/D conversion device and a D/A conversion device each having a plurality of D/A converters, and an adjusting method.

2. Related Art

Charge-redistribution type A/D conversion devices have been known as disclosed, for example, in US Patent Application Publication No. 2007-132626. The A/D conversion device described in US Patent Application Publication No. 2007-132626 includes a capacity-array type main D/A converter, a capacity-array type correction D/A converter, a comparator, and a control logic.

The main D/A converter outputs an analog voltage according to data given from the control logic. The correction D/A converter is supplied with data having a resolution less than 1 LSB (least significant bit) of the main D/A converter from the control logic, and outputs an analog voltage according to the supplied data. The comparator compares an input voltage with a total voltage obtained by adding the voltage outputted from the main D/A converter to the voltage outputted from the correction D/A converter.

The control logic changes the data supplied to the main D/A converter and the correction D/A converter, and searches for data at which the input voltage is identical to the total voltage. Then, the control logic outputs to the outside the data at which the input voltage is identical to the total voltage.

In this case, the control logic provides data corrected in accordance with DNL (Differential Non-Linearity) of the main D/A converter to the main D/A converter and the correction D/A converter. More specifically, the control logic provides an integer part of data corrected in accordance with DNL to the main D/A converter. The control logic also provides a fractional part of the data corrected in accordance with DNL to the correction D/A converter. In this way, the A/D conversion device described in US Patent Application Publication No. 2007-132626 can output a voltage whose DNL is corrected with accuracy less than 1 LSB.

Moreover, there has been known an interleave type A/D conversion device including a plurality of A/D converters. There has also been known a differential type A/D conversion device that includes a positive A/D converter and a negative A/D converter and converts a differential signal from analog to digital.

An A/D conversion device including a plurality of A/D converters, such as an interleave type or differential type conversion device generates a large linearity error as a whole when gains of the plurality of A/D converters are different from one another, even if the linearity error of each A/D converter is small. Therefore, an A/D conversion device reduces a total linearity error thereof by measuring input-output characteristics of the A/D converters with high precision using a DA converter for calibration and correcting the input-output characteristics of the A/D converters on the basis of the measurement results.

However, when correcting a linearity error in this manner, it is necessary to use a D/A converter for calibration with high precision. Therefore, the A/D conversion device requires a high cost.

SUMMARY

Therefore, it is an object of some aspects of the present invention to provide an A/D conversion device, a D/A conversion device, and an adjusting method that can solve the foregoing problems. The above and other objects can be achieved by combinations described in the independent claims. The dependent claims define further advantageous and exemplary combinations of the present invention.

According to the first aspect of the present invention, there is provided an A/D conversion device. The A/D conversion device includes: a first A/D conversion section and a second A/D conversion section that each include: a D/A converter that has a plurality of bit capacitors corresponding to bits of input data; a comparing section that compares a reference voltage with a difference voltage obtained by subtracting an analog input voltage from an output voltage of the D/A converter; and a control section that detects a data value of the input data at which the difference voltage is substantially the same as the reference voltage and outputs the data value as digital data according to the input voltage; and an adjusting section that serially connects the bit capacitors of the D/A converter of the first A/D conversion section and the bit capacitors of the D/A converter of the second A/D conversion section that correspond to the same bits, and adjusts a capacity of at least one of the bit capacitors so that a voltage between the two bit capacitors approaches a middle point of voltages of the two bit capacitors.

According to the second aspect of the present invention, there is provided an A/D conversion device. The A/D conversion device includes: a first A/D conversion section and a second A/D conversion section that each include: positive and negative D/A converters that have a plurality of bit capacitors corresponding to bits of input data; a comparing section that compares a voltage obtained by subtracting a positive input voltage from an output voltage of the positive D/A converter and a voltage obtained by subtracting an output voltage of the negative D/A converter from a negative input voltage; and a control section that detects a data value of the input data at which the output voltages outputted from the positive D/A converter and the negative D/A converter are substantially the same as each other and outputs the data value as digital data according to the input voltage; and an adjusting section that serially connects the bit capacitors of the positive D/A converter of the first A/D conversion section and the bit capacitors of the negative D/A converter of the second A/D conversion section that correspond to the same bits, and adjusts a capacity of at least one of the bit capacitors so that a voltage between the two bit capacitors approaches a middle point of voltages of the two bit capacitors.

According to the third aspect of the present invention, there is provided a D/A conversion device. The D/A conversion device includes: a first D/A converter and a second D/A converter that have a plurality of bit capacitors corresponding to bits of input data; and an adjusting section that serially connects the bit capacitors of the first D/A converter and the bit capacitors of the second D/A converter that correspond to the same bits and adjusts a capacity of at least one the bit capacitors so that a voltage between the two bit capacitors approaches a middle point of voltages of the two bit capacitors.

According to the fourth aspect of the present invention, there is provided an adjusting method for an A/D conversion device. The A/D conversion device includes a first A/D conversion section and a second A/D conversion section that each include: a D/A converter that has a plurality of bit capacitors corresponding to bits of input data; a comparing section that compares a reference voltage with a difference voltage obtained by subtracting an analog input voltage from an output voltage of the D/A converter; and a control section that detects a data value of the input data at which the difference voltage is substantially the same as the reference voltage and outputs the data value as digital data according to the input voltage, and the adjusting method includes serially connecting the bit capacitors of the D/A converter of the first A/D conversion section and the bit capacitors of the D/A converter of the second A/D conversion section that correspond to the same bits, and adjusting an electric capacity of at least one of the bit capacitors so that a voltage between the two bit capacitors approaches a middle point of voltages of the two bit capacitors.

The summary does not necessarily describe all necessary features of the present invention. The present invention may also be a sub-combination of the features described above.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
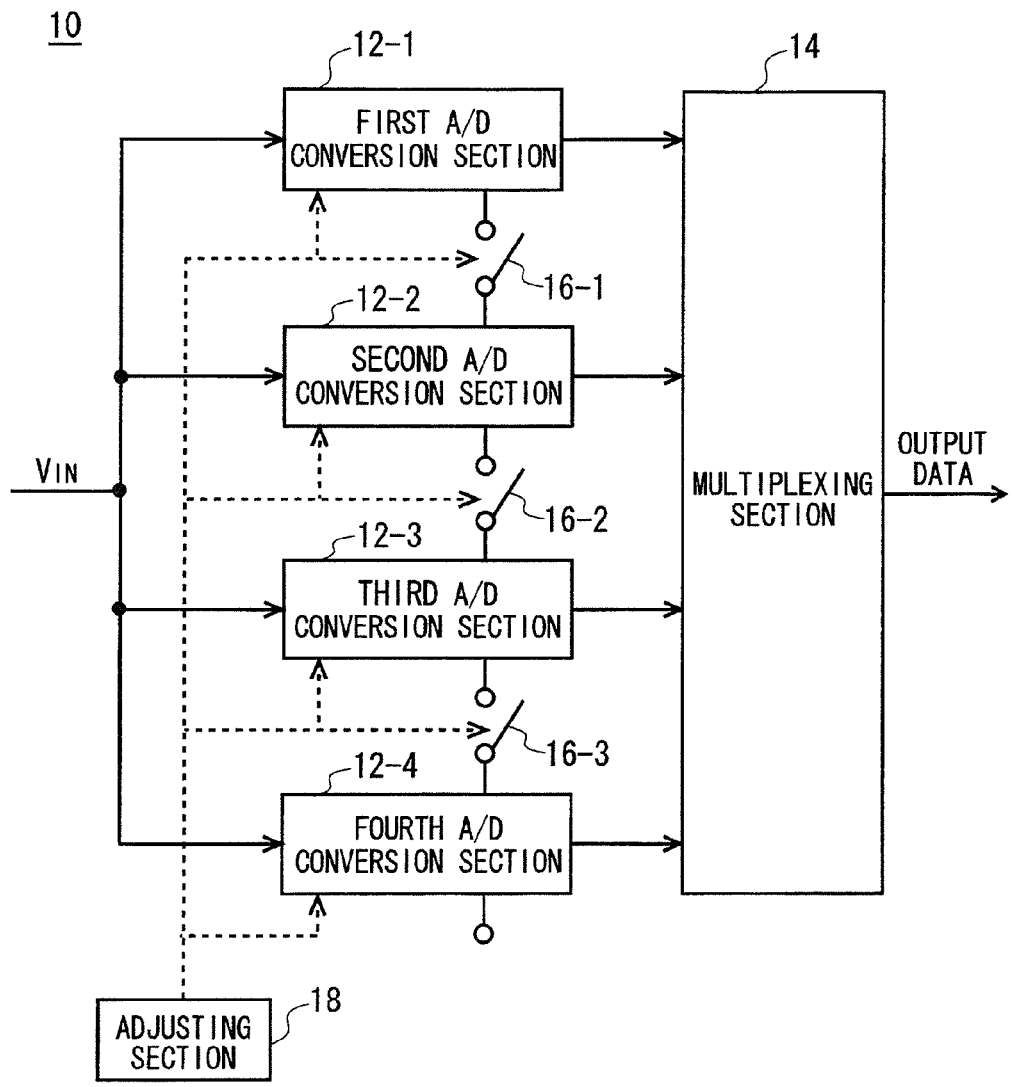
FIG. 1 shows a configuration of an A/D conversion device 10 according to the present embodiment.

FIG. 1 shows a configuration of an A/D conversion device 10 according to the present embodiment. The A/D conversion device 10 converts an analog input voltage $V_{IN}$ from analog to digital and outputs the converted digital output data.

The A/D conversion device 10 includes a plurality of A/D conversion sections 12, a multiplexing section 14, a plurality of switches 16 between output terminals, and an adjusting section 18. In the present embodiment, the A/D conversion device 10 includes a first, a second, a third, and a fourth A/D conversion sections 12-1 to 12-4 as the plurality of A/D conversion sections 12, and includes a first, a second, and a third switches 16-1 to 16-3 between output terminals as the plurality of switches 16 between output terminals.

Each of the A/D conversion sections 12 performs successive-approximation type analog-to-digital conversion. Each of the A/D conversion sections 12 has a D/A converter including a plurality of bit capacitors corresponding to bits of input data. The plurality of bit capacitors are connected to an output terminal of the D/A converter.

Moreover, the plurality of A/D conversion sections 12 may interleave the input voltage $V_{IN}$, convert the interleaved voltage from analog to digital, and output the converted voltage as digital output data $D_{OUT}$. That is to say, the A/D conversion sections 12 may be respectively supplied with sampling clocks having different phases and the same frequency, and may respectively sample the input voltage $V_{IN}$ at a given sampling clock timing and convert the sampled voltage from analog to digital.

The multiplexing section 14 selects the output data outputted from the plurality of A/D conversion sections 12 in a circulating way and in order of phases and multiplexes the selected data. Then, the multiplexing section 14 outputs the multiplexed output data sequence. The multiplexing section 14 can output the same output data sequence as that of the case when the input voltage $V_{IN}$ is converted from analog to digital by means of a conversion frequency higher than the frequency of the sampling clock.

Each of the plurality of switches 16 between output terminals selects whether the output terminals of the D/A converter of the two adjacent A/D conversion sections 12 among the plurality of A/D conversion sections 12 are connected to each other. In the present example, the first switch 16-1 between output terminals selects whether the output terminal of the D/A converter of the first A/D conversion section 12-1 is connected to the output terminal of the D/A converter of the second A/D conversion section 12-2. The second switch 16-2 between output terminals selects whether the output terminal of the D/A converter of the second A/D conversion section 12-2 is connected to the output terminal of the D/A converter of the third A/D conversion section 12-3. The third switch 16-3 between output terminals selects whether the output terminal of the D/A converter of the third A/D conversion section 12-3 is connected to the output terminal of the D/A converter of the fourth A/D conversion section 12-4.

The adjusting section 18 adjusts characteristics (that is to say, input-output characteristics) of output data that is output in response to an input voltage inputted into each of the plurality of A/D conversion sections 12. More specifically, the adjusting section 18 turns on the first switch 16-1 between output terminals, and then serially connects the bit capacitors of the D/A converter of the first A/D conversion section 12-1 and the bit capacitors of the D/A converter of the second A/D conversion section 12-2 that correspond to the same bits. In this case, the adjusting section 18 previously discharges the bit capacitors. Initial charges accumulated by the bit capacitors become zero. The adjusting section 18 adjusts the capacity of at least one of the bit capacitors corresponding to the same bits so that a voltage between the two corresponding bit capacitors approaches a middle point of voltages of the two bit capacitors. In this way, the adjusting section 18 can match the capacity of the bit capacitors of the D/A converter of the first A/D conversion section 12-1 with the capacity of the bit capacitors of the D/A converter of the second A/D conversion section 12-2 that correspond to the same bits.

The adjusting section 18 further turns on the second switch 16-2 between output terminals, and then serially connects the bit capacitors of the D/A converter of the second A/D conversion section 12-2 and the bit capacitors of the D/A converter of the third A/D conversion section 12-3 that correspond to the same bits. In this case, the adjusting section 18 previously discharges the bit capacitors. Initial charges accumulated by the bit capacitors become zero. The adjusting section 18 adjusts the capacity of the bit capacitors of the D/A converter of the third A/D conversion section 12-3 so that a voltage between the two bit capacitors corresponding to the same bit approaches a middle point of voltages of the two bit capacitors. In this way, the adjusting section 18 can match the capacity of the bit capacitors of the D/A converter of the third A/D conversion section 12-3 with the capacity of the bit capacitors of the D/A converter of the second A/D conversion section 12-2 that correspond to the same bits.

The adjusting section 18 further turns on the third switch 16-3 between output terminals, and then serially connects the bit capacitors of the D/A converter of the third A/D conversion section 12-3 and the bit capacitors of the D/A converter of the fourth A/D conversion section 12-4 that correspond to the same bits. In this case, the adjusting section 18 previously discharges the bit capacitors. Initial charges accumulated by the bit capacitors become zero. The adjusting section 18 adjusts the capacity of the bit capacitors of the D/A converter of the fourth A/D conversion section 12-4 so that a voltage between the two bit capacitors corresponding to the same bit approaches a middle point of voltages of the two bit capacitors. In this way, the adjusting section 18 can match the capacity of the bit capacitors of the D/A converter of the fourth A/D conversion section 12-4 with the capacity of the bit capacitors of the D/A converter of the third A/D conversion section 12-3 that correspond to the same bits.

Figure 2:
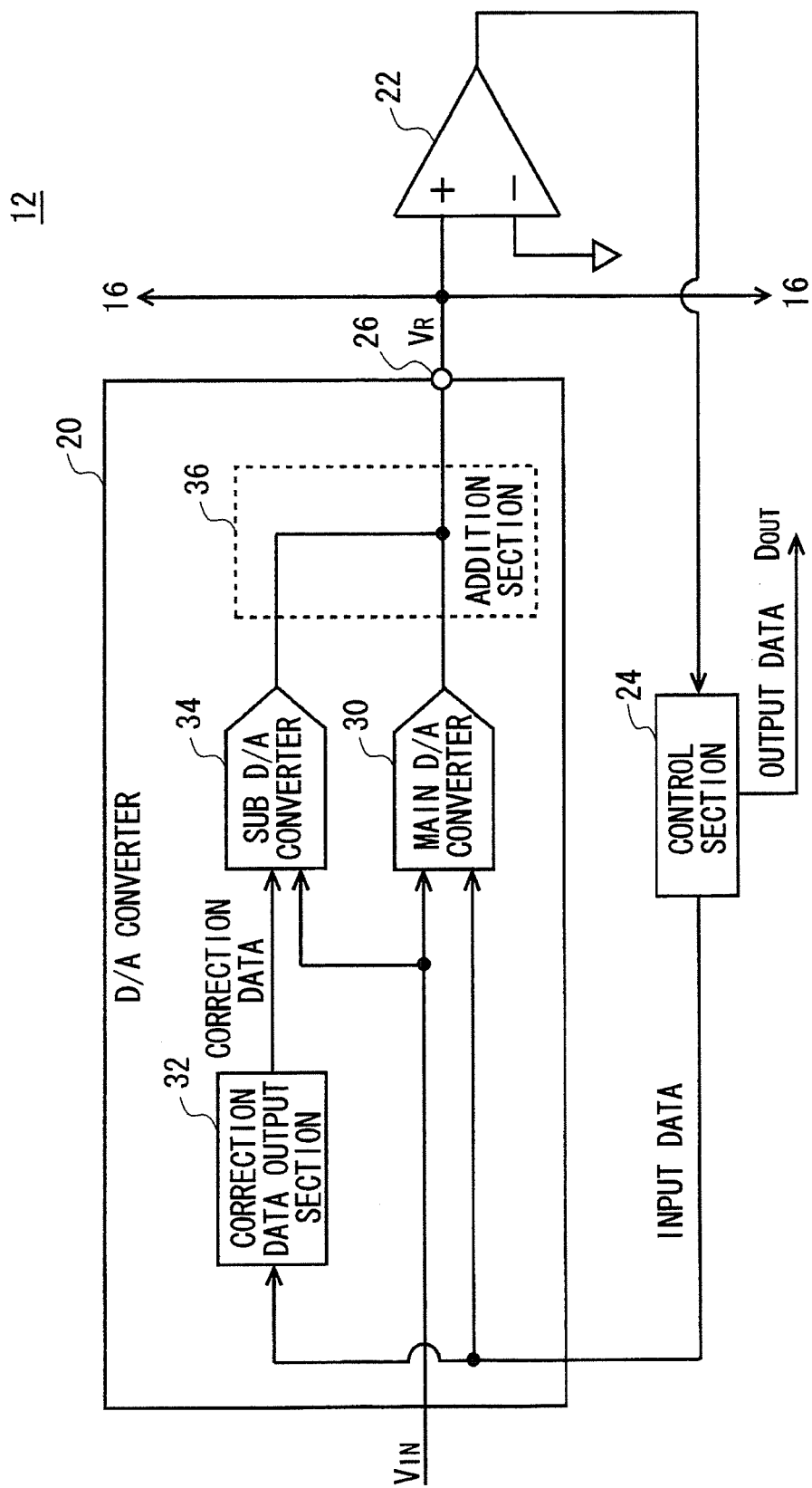
FIG. 2 shows a configuration of an A/D conversion section 12.

FIG. 2 shows a configuration of each of the A/D conversion sections 12. In addition, each of the A/D conversion sections 12 may have the same internal configuration.

The A/D conversion section 12 has a D/A converter 20, a comparing section 22, and a control section 24. The A/D conversion section 12 outputs digital output data $D_{OUT}$ having a predetermined number of bits in response to an analog input voltage $V_{IN}$.

The D/A converter 20 generates an analog voltage according to digital input data given from the control section 24. In the present embodiment, the D/A converter 20 has a main D/A converter 30, a correction data output section 32, a sub D/A converter 34, and an addition section 36.

The main D/A converter 30 is supplied with input data from the control section 24. The main D/A converter 30 outputs a main voltage according to the given input data. Then, the main D/A converter 30 gives the main voltage to an output terminal 26 of the corresponding D/A converter 20.

In the present embodiment, the main D/A converter 30 is a charge-redistribution type D/A converter that has a capacitor ladder including a plurality of bit capacitors corresponding to bits of input data. That is to say, the main D/A converter 30 samples the input voltage $V_{IN}$ by inputting electric charges according to the input voltage $V_{IN}$ into the capacitor ladder during sampling. The main D/A converter 30 holds the input voltage $V_{IN}$ during holding without discharging the electric charges input into the capacitor ladder to the outside. Furthermore, during holding, the main D/A converter 30 receives the input data from the control section 24 and outputs a main voltage obtained by subtracting the input voltage $V_{IN}$ from a voltage according to the input data.

The correction data output section 32 is supplied with input data from the control section 24. The correction data output section 32 outputs correction data according to the given input data. The correction data output section 32 may output correction data that causes the sub D/A converter 34 to output a voltage (a correction voltage) offsetting an error (a linearity error) between an ideal voltage of the main D/A converter 30 according to the input data and the real output voltage of the main D/A converter 30 according to the input data. The correction data output section 32 may further output correction data that causes the sub D/A converter 34 to output a voltage offsetting an erroneous offset in the comparing section 22 in addition to the linearity error.

The sub D/A converter 34 is supplied with the correction data outputted from the correction data output section 32. The sub D/A converter 34 outputs a correction voltage according to the given correction data.

In the present embodiment, the sub D/A converter 34 is a charge-redistribution type D/A converter that has a capacitor ladder including at least one correction capacitor corresponding to bits of correction data. That is to say, the sub D/A converter 34 samples an input voltage $V_{IN}$ by inputting electric charges according to the input voltage $V_{IN}$ into the capacitor ladder during sampling. The sub D/A converter 34 holds the input voltage $V_{IN}$ during holding without discharging the electric charges input into the capacitor ladder to the outside. The sub D/A converter 34 further receives the correction data from the correction data output section 32 and outputs a correction voltage obtained by subtracting the input voltage $V_{IN}$ from a voltage according to the correction data, during holding.

The addition section 36 adds the correction voltage outputted from the sub D/A converter 34 to the main voltage outputted from the main D/A converter 30. As an example, the addition section 36 may be a connection node that connects an output port of the sub D/A converter 34 and an output port of the main D/A converter 30. The D/A converter 20 according to the present embodiment can output from the output terminal 26 a difference voltage $V_R$ obtained by subtracting the analog input voltage $V_{IN}$ from the voltage according to the input data, during holding.

The comparing section 22 compares a reference voltage (for example, a common voltage) with the difference voltage $V_R$ obtained by subtracting the analog input voltage $V_{IN}$ from the output voltage outputted from the D/A converter 20 according to the input data. In the present embodiment, the comparing section 22 compares the reference voltage with the difference voltage $V_R$ outputted from the output terminal 26 of the D/A converter 20, and outputs the comparison result. As an example, the comparing section 22 may output as the comparison result a logical value expressing which of comparative voltages $V_R$ is larger.

The control section 24 detects a data value of the input data at which the difference voltage $V_R$ is substantially identical to the reference voltage, and outputs the data value as digital output data $D_{OUT}$ according to the input voltage $V_{IN}$. More specifically, the control section 24 gives input data having, for example, the same number of bits as the output data $D_{OUT}$ to the D/A converter 20, during holding the input voltage $V_{IN}$. The control section 24 changes the input data, and detects input data at which the input voltage $V_{IN}$ is identical to the difference voltage $V_R$, on the basis of the comparison results when the comparing section 22 performs comparison on each value of the changed input data. For example, the control section 24 may detect input data at which the input voltage $V_{IN}$ is identical to the difference voltage $V_R$ by means of a successive approximation process.

As an example, the control section 24 may detect input data that causes the D/A converter 20 to generate the maximum difference voltage $V_R$ less than the input voltage $V_{IN}$ or input data that causes the D/A converter 20 to generate the minimum difference voltage $V_R$ greater than the input voltage $V_{IN}$ as input data at which the input voltage $V_{IN}$ is identical to the difference voltage $V_R$. The control section 24 then outputs the detected input data as the output data $D_{OUT}$.

In addition, the main D/A converter 30 and the sub D/A converter 34 may have a configuration without a sampling and holding function. In other words, the main D/A converter 30 and the sub D/A converter 34 may have a configuration in which there is only the function of outputting a voltage according to input data without inputting the input voltage $V_{IN}$. In this case, the A/D conversion section 12 further includes a sample-hold circuit that samples and holds the input voltage $V_{IN}$ and a subtraction section. The subtraction section gives a difference voltage $V_R$ obtained by subtracting the input voltage $V_{IN}$ sampled by the sample-hold circuit from the voltage outputted from the D/A converter 20 to the comparing section 22. In this way, the comparing section 22 can output the comparison result obtained by comparing the input voltage $V_{IN}$ and the difference voltage $V_R$.

Moreover, the A/D conversion section 12 may further include another sample-hold circuit, even if the main D/A converter 30 and the sub D/A converter 34 have a sampling and holding function. In this case, the A/D conversion section 12 further includes a sample-hold circuit at a preceding stage of the D/A converter 20.

Figure 3:
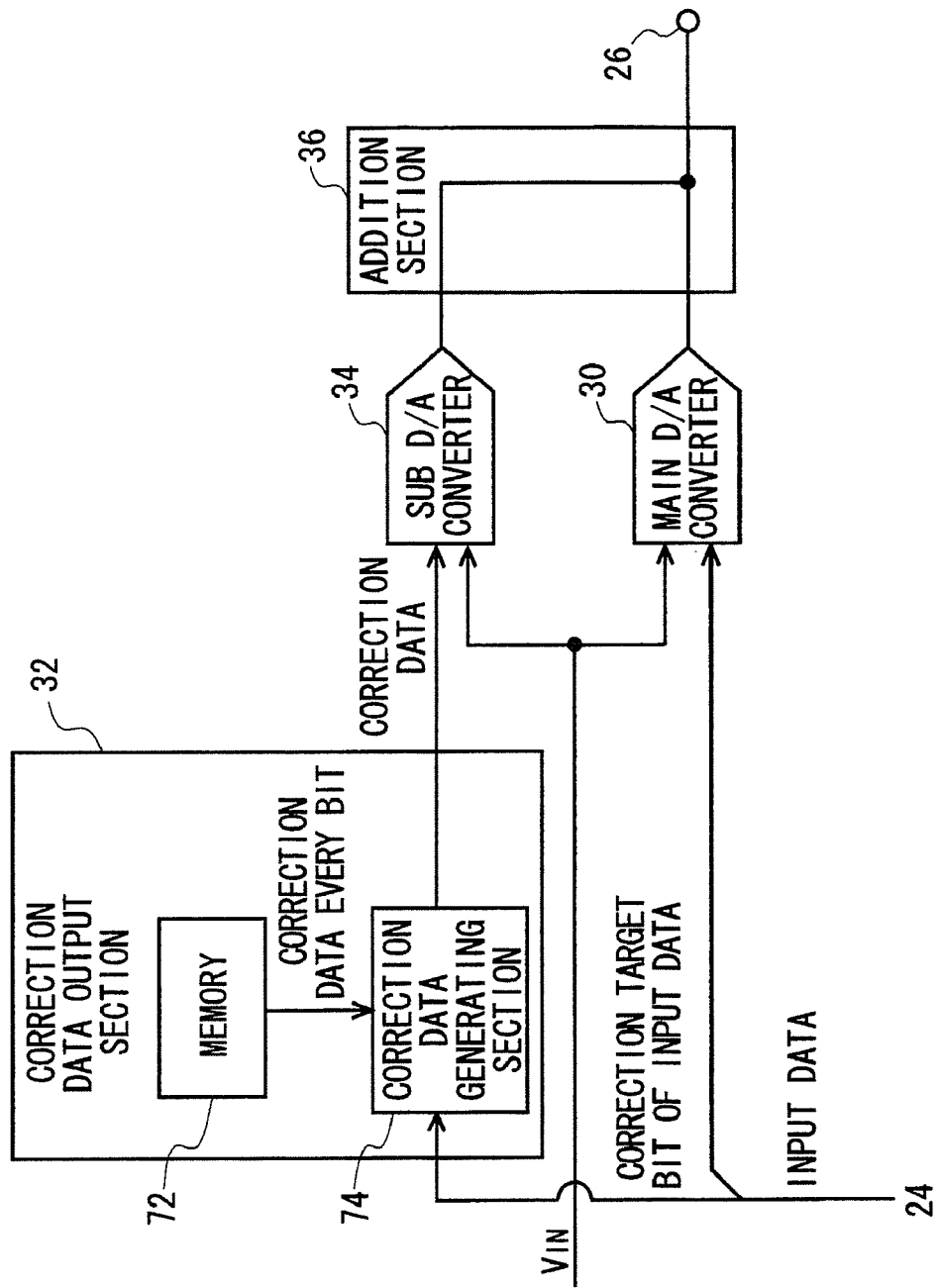
FIG. 3 shows an exemplary configuration of a correction data output section 32 along with a main D/A converter 30, a sub D/A converter 34, and an addition section 36.

FIG. 3 shows an exemplary configuration of the correction data output section 32 along with the main D/A converter 30, the sub D/A converter 34, and the addition section 36. As an example, the D/A converter 20 may set correction data corresponding to a plurality of bits of input data. The correction data for each bit may be equal to correction data for input data at which the target bit is one and the other bits are zero.

In this case, the correction data output section 32 accumulates and adds correction data corresponding to bits whose value is one in the input data, and outputs the accumulated result to the sub D/A converter 34 as correction data. In this way, the correction data output section 32 can make the sub D/A converter 34 correct a linearity error of the main D/A converter 30.

Furthermore, the linearity error of the main D/A converter 30 may largely depend on errors of high-order bits among all bits of the input data. As an example, in the D/A converter 20, a part of high-order bits of the input data may be determined as a correction target bit. Then, the correction data output section 32 accumulates and adds correction data corresponding to correction bits whose a value is one among one or more correction target bits in the input data, and outputs the accumulated result as correction data.

As an example, the correction data output section 32 may include a memory 72 and a correction data generating section 74. The memory 72 stores correction data for each bit of the correction target bits.

The correction data generating section 74 receives input data from the control section 24. The correction data generating section 74 selects a correction bit whose a value is one among one or more correction target bits in the input data. The correction data generating section 74 reads correction data corresponding to the selected correction target bits from the memory 72, and accumulates and adds the read correction data. The correction data generating section 74 then outputs the accumulated result as correction data. In this way, the correction data output section 32 can output correction data obtained by accumulating and adding the correction data for the bits.

Figure 4:
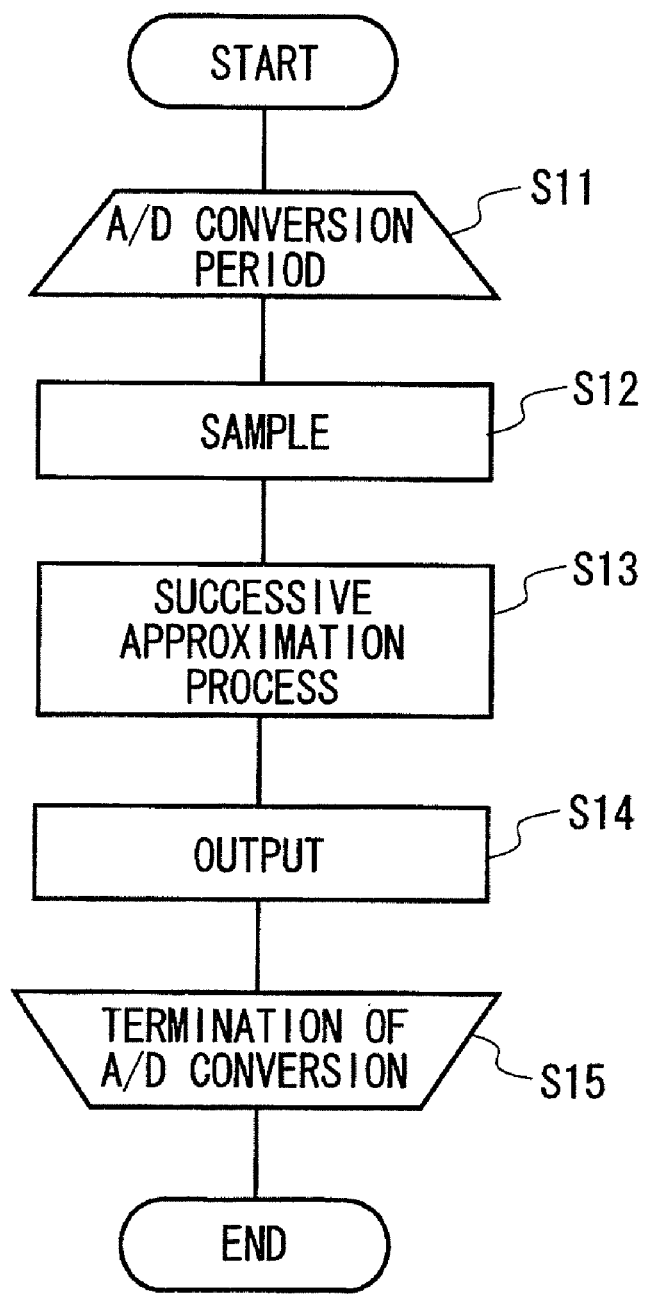
FIG. 4 shows a flow of an AD conversion process by the A/D conversion device 10.

FIG. 4 shows a flow of an AD conversion process of the A/D conversion device 10. The A/D conversion device 10 repeatedly executes the processes of steps S12 to S14 every A/D conversion period (sampling period) (S11, S15).

First, the A/D conversion device 10 samples an input voltage $V_{IN}$ (S12). In the present embodiment, the main D/A converter 30 and the sub D/A converter 34 input electric charges according to the input voltage $V_{IN}$ into the capacitor ladder.

The A/D conversion device 10 subsequently holds the sampled input voltage $V_{IN}$. In the present embodiment, the main D/A converter 30 and the sub D/A converter 34 perform a control operation so that the electric charges input into the capacitor ladder are not discharged to the outside. Then, the A/D conversion device 10 detects output data $D_{OUT}$ expressing a digital value according to the input voltage $V_{IN}$ by means of a successive approximation process, during holding the input voltage $V_{IN}$ (S13).

The A/D conversion device 10 subsequently outputs the detected output data $D_{OUT}$ to the outside when the detection of the output data $D_{OUT}$ is completed. In addition, the A/D conversion device 10 may output the output data $D_{OUT}$ detected during the A/D conversion period during a period after the A/D conversion period.

The A/D conversion device 10 repeats the processes of the above-described steps S12 to S14 until a termination instruction for the A/D conversion process is given. In this way, the A/D conversion device 10 can convert an analog voltage signal into a digital data signal.

Figure 5:
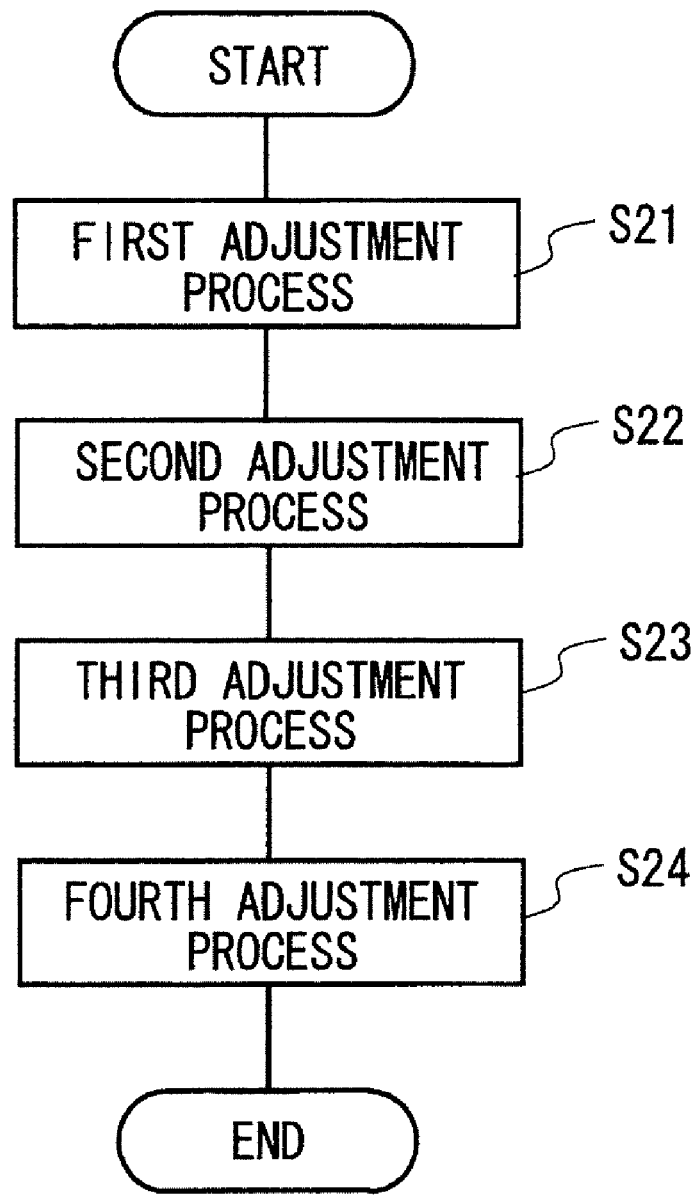
FIG. 5 shows a flow of an adjustment process of a plurality of A/D conversion sections 12 by an adjusting section 18.

FIG. 5 shows a flow of an adjustment process of the plurality of A/D conversion sections 12 using the adjusting section 18. In the present embodiment, the adjusting section 18 sequentially selects one by one from the first A/D conversion section 12-1 to the fourth A/D conversion section 12-4, and performs an adjustment process for adjusting correction data in the internal D/A converter 20, in advance of the A/D conversion process.

First, the adjusting section 18 executes a first adjustment process (S21) for adjusting the D/A converter 20 of the first A/D conversion section 12-1. In the first adjustment process, the adjusting section 18 modifies the correction data so that a voltage outputted from the D/A converter 20 approaches a voltage according to input data. In this case, the adjusting section 18 may modify the correction data on the basis of the comparison result between the reference voltage and the output voltage of the D/A converter 20 of the first A/D conversion section 12-1, which is outputted from the comparing section 22 of the first A/D conversion section 12-1. In this way, the adjusting section 18 can adjust a capacity of each bit capacitor of the D/A converter of the first A/D conversion section 12-1 to a predetermined value.

The adjusting section 18 subsequently executes a second adjustment process (S22) for adjusting the D/A converter 20 of the second A/D conversion section 12-2 after the first adjustment process. In the second adjustment process, the adjusting section 18 turns on the first switch 16-1 between output terminals, and then serially connects the bit capacitors whose a capacity is corrected by the at least one correction capacitor of the first A/D conversion section 12-1 and the bit capacitors, corresponding to the same bits as those of the first A/D conversion section 12-1, whose a capacity is corrected by the at least one correction capacitor of the second A/D conversion section 12-2. In this case, the adjusting section 18 previously discharges the bit capacitors. Initial charges accumulated by the bit capacitors become zero. Then, the adjusting section 18 may adjust the correction data outputted from the correction data output section 32 of the second A/D conversion section 12-2 so that a voltage between the two bit capacitors approaches a middle point of voltages of the two bit capacitors. In this way, the adjusting section 18 can match the capacity of the bit capacitors of the D/A converter of the first A/D conversion section 12-1 with the capacity of the bit capacitors of the D/A converter of the second A/D conversion section 12-2 that correspond to the same bits.

Moreover, in the second adjustment process, the adjusting section 18 may adjust the correction data on the basis of the comparison result between the reference voltage and the voltage between the two bit capacitors, which is outputted from the at least one comparing section 22 of the first A/D conversion section 12-1 and the second A/D conversion section 12-2. Alternatively, the adjusting section 18 may correct the correction data on the basis of the comparison results between the reference voltage and the voltage between the two bit capacitors, which are outputted from the comparing sections 22 of the first A/D conversion section 12-1 and the second A/D conversion section 12-2.

The adjusting section 18 subsequently executes a third adjustment process (S23) for adjusting the D/A converter 20 of the third A/D conversion section 12-3 after the second adjustment process. In the third adjustment process, the adjusting section 18 adjusts correction data outputted from the correction data output section 32 of the third A/D conversion section 12-3 similarly to the second adjustment process, using the second A/D conversion section 12-2 as a standard.

That is to say, in the third adjustment process (S23), the adjusting section 18 turns on the second switch 16-2 between output terminals, and serially connects the bit capacitors whose a capacity is corrected by the at least one correction capacitor of the second A/D conversion section 12-2 and the bit capacitors, corresponding to the same bits as those of the second A/D conversion section 12-2, whose a capacity is corrected by the at least one correction capacitor of the third A/D conversion section 12-3. In this case, the adjusting section 18 previously discharges the bit capacitors. Initial charges accumulated by the bit capacitors become zero. Then, the adjusting section 18 adjusts the correction data outputted from the correction data output section 32 of the third A/D conversion section 12-3 so that a voltage between the two bit capacitors approaches a middle point of voltages of the two bit capacitors. In this way, the adjusting section 18 can match the capacity of the bit capacitors of the D/A converter of the third A/D conversion section 12-3 with the capacity of the bit capacitors of the D/A converter of the second A/D conversion section 12-2 that correspond to the same bits.

The adjusting section 18 subsequently executes a fourth adjustment process (S24) for adjusting the D/A converter 20 of the fourth A/D conversion section 12-4 after the third adjustment process. In the fourth adjustment process, the adjusting section 18 adjusts correction data outputted from the correction data output section 32 of the fourth A/D conversion section 12-4 similarly to the third adjustment process, using the third A/D conversion section 12-3 as a standard. In this way, the adjusting section 18 can match the capacity of the bit capacitors of the D/A converter of the fourth A/D conversion section 12-4 with the capacity of the bit capacitors of the D/A converter of the third A/D conversion section 12-3 that correspond to the same bits.

By the above process, the adjusting section 18 can adjust input-output characteristics of the D/A converter 20 of the first A/D conversion section 12-1 to a predetermined characteristic. The adjusting section 18 can further match input-output characteristics of the D/A converters 20 of the second to the fourth A/D conversion sections 12-2 to 12-4 with an input-output characteristic of the D/A converter 20 of the first D/A converter 20-1.

According to the A/D conversion device 10, it is possible to easily match input-output characteristics of the plurality of A/D conversion sections 12 with each other with high precision. In this way, the A/D conversion device 10 can execute A/D conversion with small linearity error and with high precision.

Figure 6:
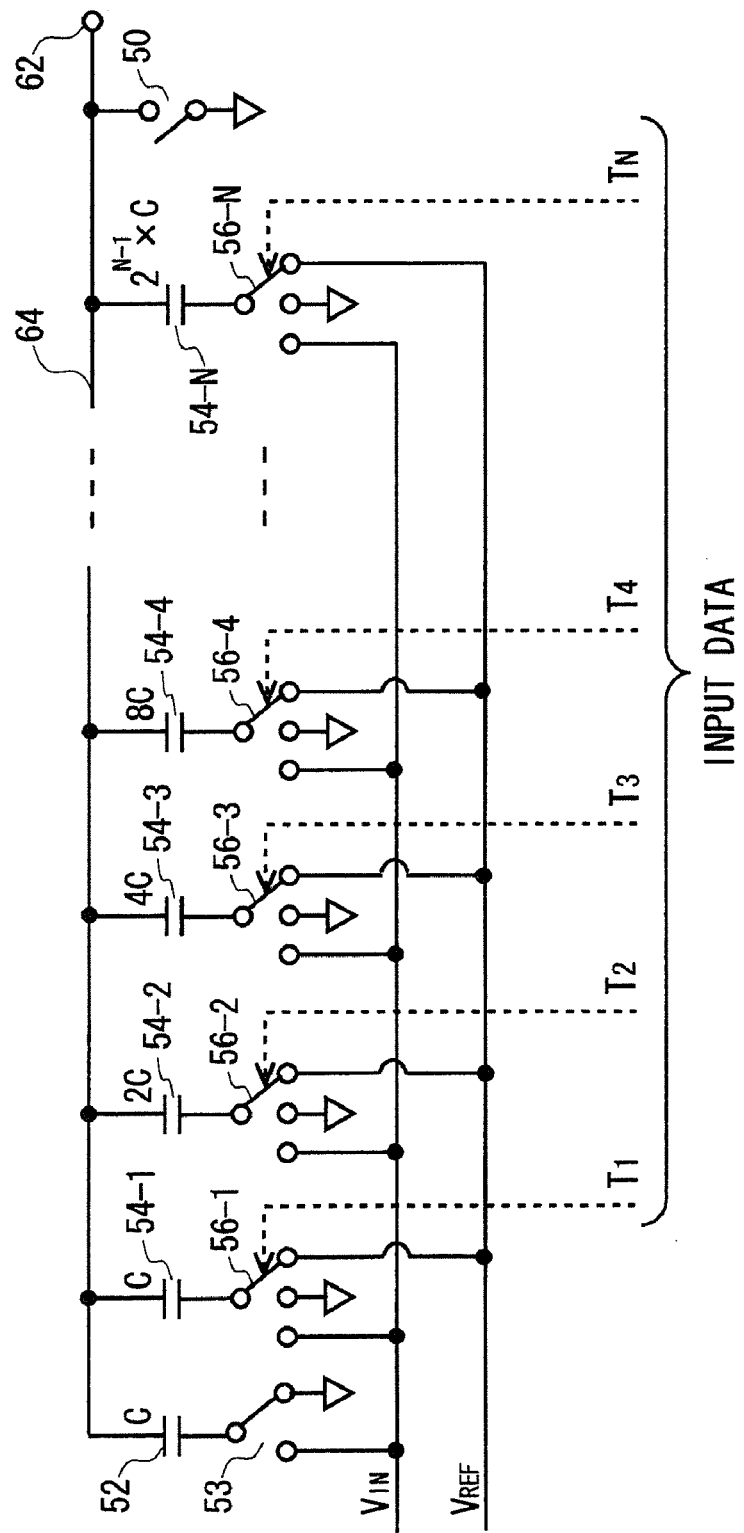
FIG. 6 shows a first example of a configuration of the charge-redistribution-type main D/A converter 30.
Figure 7:
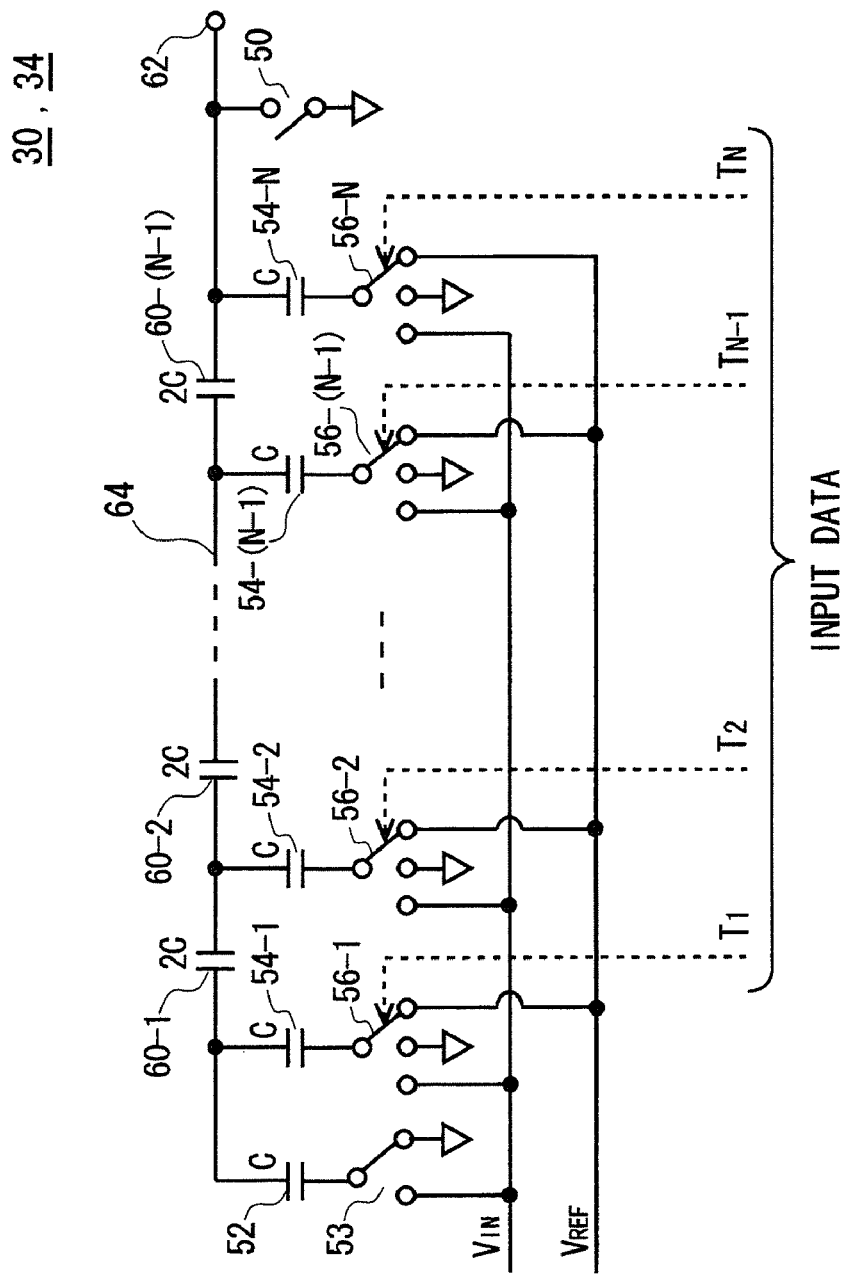
FIG. 7 shows a second example of a configuration of the charge-redistribution-type main D/A converter 30.
Figure 8:
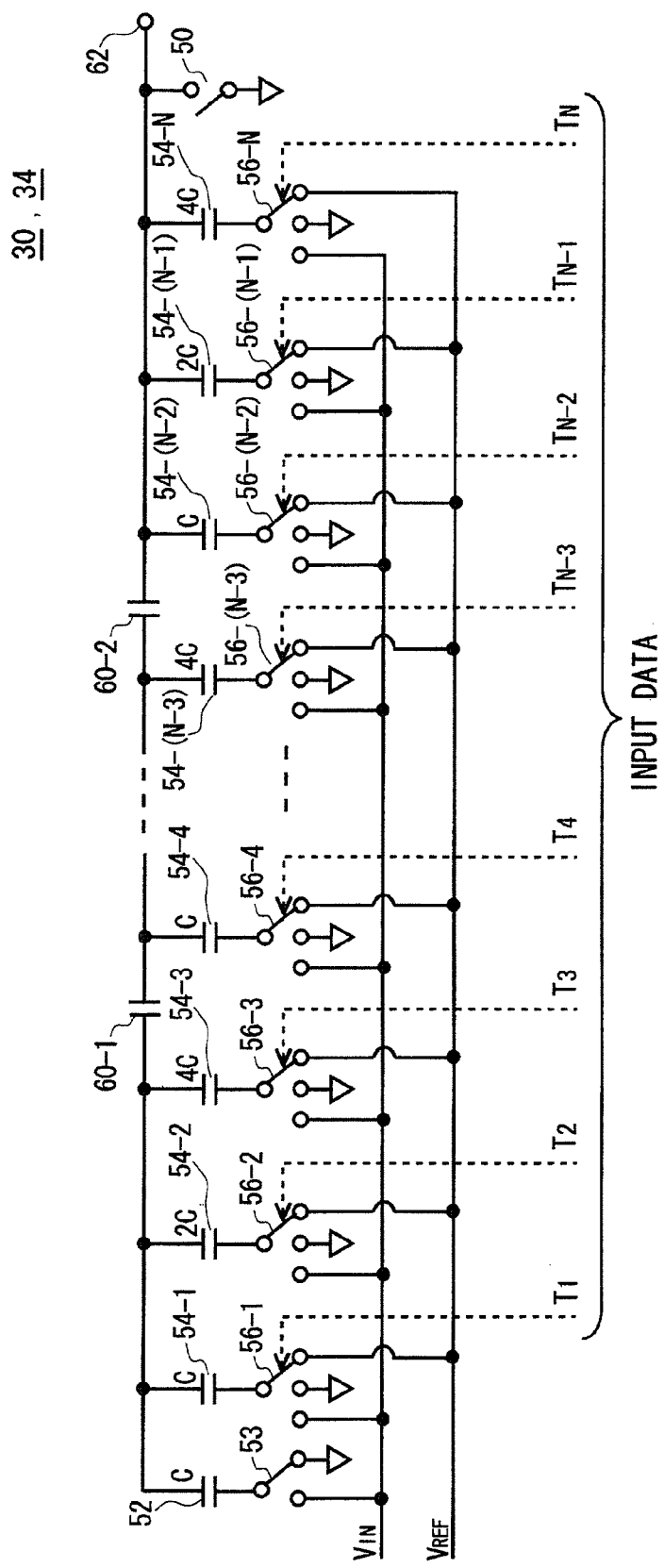
FIG. 8 shows a third example of a configuration of the charge-redistribution-type main D/A converter 30

FIG. 6 shows a first example of the configuration of the charge-redistribution-type main D/A converter 30. FIG. 7 shows a second example of the configuration of the charge-redistribution-type main D/A converter 30. FIG. 8 shows a third example of the configuration of the charge-redistribution-type main D/A converter 30. It should be noted that the main D/A converter 30 and the sub D/A converter 34 are different from each other in that the number of bits of given data (input data or correction data) is different. In addition, a member is referred to as the bit capacitors 54 in the main D/A converter 30, but the same member is referred to as the correction capacitor in the sub D/A converter 34. However, since the main D/A converter 30 and the sub D/A converter 34 have the generally same function and configuration for the rest, the descriptions are omitted about the sub D/A converter 34 in regard to FIGS. 6, 7, and 8.

The main D/A converter 30 includes a sample switch 50, a dummy capacitor 52, a switch for dummy 53, a plurality of bit capacitors 54, and a plurality of first switches 56. The sample switch 50 is arranged between an output port 62 of the main D/A converter 30 and a standard potential. The sample switch 50 short-circuits the output port 62 and the standard potential during sampling. The sample switch 50 opens the output port 62 and the standard potential during holding.

One end of the dummy capacitor 52 is connected to the standard potential or the input voltage $V_{IN}$ via the switch for dummy 53. The other end of the dummy capacitor 52, which is not connected to the standard potential or the input voltage $V_{IN}$, is connected to the output port 62 of the main D/A converter 30 via an output wire 64. One end of the switch for dummy 53, which is not connected to the output wire 64 of the dummy capacitor 52, is connected to the input voltage $V_{IN}$ during sampling. The one end of the switch for dummy 53, which is not connected to the output wire 64 of the dummy capacitor 52, is connected to the standard potential during holding.

The plurality of bit capacitors 54 are respectively provided in correspondence with the plurality of bits of the input data, and each have capacities according to weights of the bits of the input data. As an example, the main D/A converter 30 may include a first bit capacitor 54-1 corresponding to the first low-order bit (the least significant bit) of the input data, a second bit capacitors 54-2 corresponding to the second low-order bit of the input data, . . . and an Nth bit capacitor 54-N corresponding to the most significant bit (N is the number of bits of the input data) of the input data.

One end of each of the plurality of bit capacitors 54 is connected to the output wire 64 that connects the other end of the dummy capacitor 52 and the output port 62. As an example, in the plurality of bit capacitors 54, the bit capacitors 54 corresponding to high-order bit are connected to the output wire 64 near the output port 62 of the main D/A converter 30. In addition, in the sub D/A converter 34, the plurality of bit capacitors 54 are respectively provided in correspondence with the plurality of bits of the correction data, and function as correction capacitors having capacities according to weights of bits of the correction data.

The plurality of first switches 56 are provided in correspondence with the plurality of bits of the input data. The main D/A converter 30, as an example, may include a first 56-1 of the first switches corresponding to the first bit from a low order of the input data, a second 56-2 of the first switches corresponding to the second bit from the low order of the input data, . . . and an Nth 56-N of the first switches corresponding to the most significant bit of the input data.

The other end (hereinafter, referred to as the other end of the bit capacitor 54) of each of the plurality of first switches 56, which is not connected to the output wire 64 of the corresponding bit capacitors 54, is connected to the input voltage $V_{IN}$ during sampling. In each of the plurality of first switches 56, the other end of the corresponding bit capacitor 54 is connected to the reference potential and the standard potential in accordance with a value of the corresponding bit of the input data, during holding. In each of the plurality of first switches 56, the other end of the corresponding bit capacitor 54 may be connected to the reference potential $V_{REF}$ when the value of the corresponding bit of the input data is one as an example. In each of the plurality of first switches 56, the other end of the corresponding bit capacitor 54 may be connected to the standard potential when the value of the corresponding bit of the input data is zero as an example.

The main D/A converter 30 may further include at least one serial capacitor 60 as shown in FIGS. 7 and 8. The serial capacitors 60 are serially arrayed on the output wire 64. In other words, each serial capacitor 60 is inserted into the output wire 64 between the two adjacent bit capacitors 54. The main D/A converter 30 including the serial capacitor 60 can reduce a total composite capacity seen from the output port 62.

The main D/A converter 30 may include the serial capacitors 60 at all positions between the two adjacent bit capacitors 54 as shown in FIG. 7. Alternatively, the main D/A converter 30 may include the serial capacitors 60 at some positions between the two adjacent bit capacitors 54 as shown in FIG. 8.

The main D/A converter 30 sets a capacity of each capacitor so that a capacity of one of the bit capacitors 54 is equal to a composite capacity of the bit capacitors 54, the serial capacitor 60, and the dummy capacitor 52 that are connected to the output wire 64 located at a lower side than the one bit capacitor 54. In other words, a capacity of each capacitor is set so that the capacity Ck of the bit capacitor 54 corresponding to the kth bit is equal to a composite capacity of the circuit located at a low-order side (the dummy capacitor 52 side) from a connecting point of the output wire 64 at which the bit capacitor 54 corresponding to the kth bit is connected. In this way, the main D/A converter 30 can connect a capacity proportional to the weight of the corresponding bit to the reference potential $V_{REF}$ or the standard potential in accordance with each value of the plurality of bits of the input data.

In the charge-redistribution-type main D/A converter 30, the sample switch 50 is turned on to connect the output port 62 to the standard potential, and the plurality of first switches 56 selects the input voltage $V_{IN}$ to apply the input voltage $V_{IN}$ to each of the other ends of the plurality of bit capacitors 54, during sampling. In this way, the main D/A converter 30 can acquire electric charges according to the input voltage $V_{IN}$ and sample the input voltage $V_{IN}$, during sampling.

On the other hand, the charge-redistribution-type main D/A converter 30, the sample switch 50 is turned off to open the output port 62, and the input voltage $V_{IN}$ is not applied to each of the other ends of the plurality of bit capacitors 54, during holding. In this way, since the main D/A converter 30 does not discharge electric charges according to the input voltage $V_{IN}$ to the outside during holding, the main D/A converter 30 can apply a backward voltage $(-V_{IN})$ of the input voltage $V_{IN}$ into the output port 62 to hold the backward voltage.

Additionally, during holding, the reference potential $V_{REF}$ is connected to the other end of each of the plurality of bit capacitors 54 when the value of the corresponding bit of the input data is one, and the standard potential is connected to the other end when the value of the corresponding bit of the input data is zero. In this way, the output port 62 is connected to the reference potential VREF via a capacity proportional to a value obtained by adding weights whose values are one, and is connected to the standard potential via a capacity proportional to a value obtained by adding weights whose values are zero.

Therefore, during holding, the dummy capacitor 52 and the plurality of bit capacitors 54 can apply a difference voltage $V_R$ expressed with the following Equation (1) into the output port 62 of the main D/A converter 30. In Equation (1), T1 shows a value of the first bit (the least significant bit) from the low order of the input data, T2 shows a value of the second bit from the low order of the input data, . . . and TN shows a value of the Nth bit (the most significant bit) from the low order of the input data.

$$V_R = \{(V_{REF}/2^1) \times (T_N) + (V_{REF}/2^2) \times (T_{N-1}) + \ldots + (V_{REF}/2^{N-1}) \times (T_2) + (V_{REF}/2^N) \times (T_1)\} \quad (1)$$

From the above, the backward voltage $(-V_{IN})$ of the input voltage $V_{IN}$ and the difference voltage $V_R$ expressed with the above Equation (1) are applied into the output port 62 during holding. Therefore, the charge-redistribution-type main D/A converter 30 can output from the output port 62 a voltage (that is to say, the difference voltage $V_R$) which is obtained by adding the backward voltage $(-V_{IN})$ of the input voltage $V_{IN}$ and the voltage according to the input data, during holding.

Figure 9:
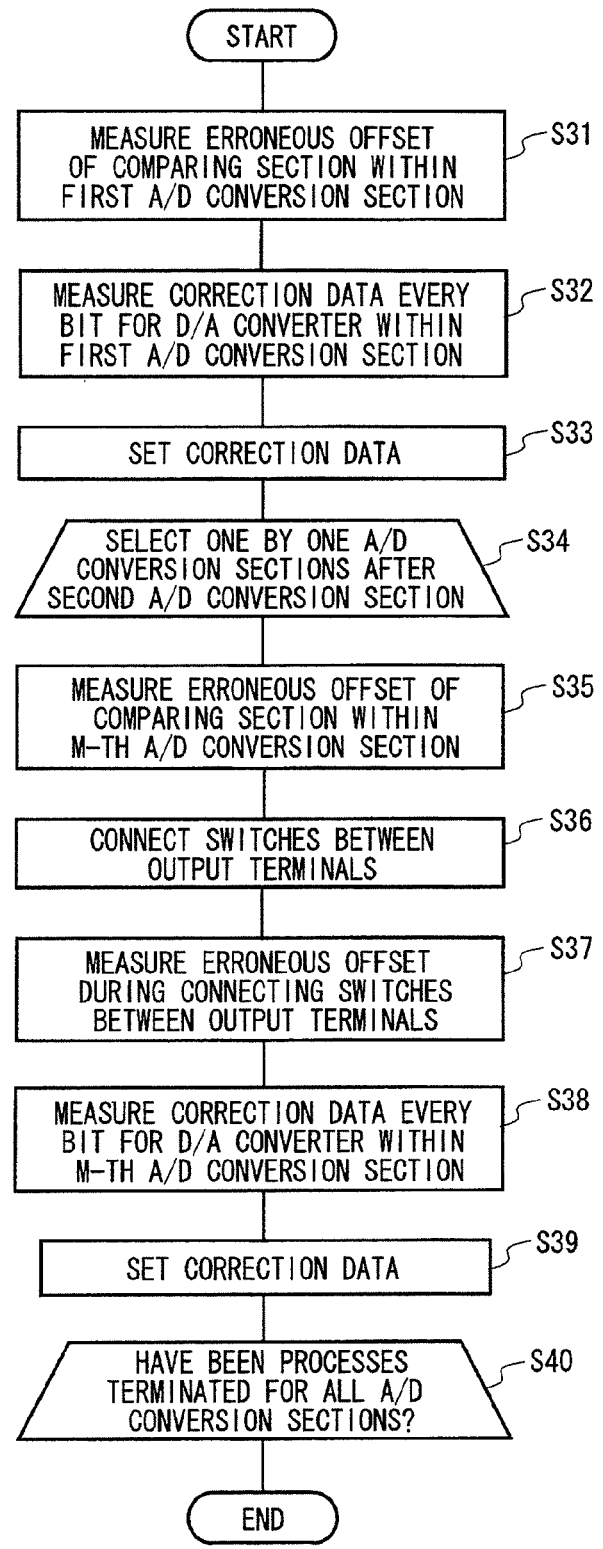
FIG. 9 shows a more concrete example of a process flow of the adjusting section 18.

FIG. 9 shows a more concrete example of a process flow of the adjusting section 18. When the D/A converter 20 has the main D/A converter 30 and the sub D/A converter 34 as shown in FIGS. 6 to 8, the adjusting section 18, as an example, may execute processes of steps S31 to S40.

First, the adjusting section 18 measures an erroneous offset of the comparing section 22 of the first A/D conversion section 12-1 (S31). In addition, a method for measuring an erroneous offset of the comparing section 22 of the first A/D conversion section 12-1 in step S31 will be described in detail with reference to FIG. 10.

The adjusting section 18 subsequently measures correction data for each of the correction target bits in the D/A converter 20 of the first A/D conversion section 12-1 (S32). In addition, a method for measuring correction data for bits in the D/A converter 20 of the first A/D conversion section 12-1 in step S32 will be described in detail with reference to FIG. 11.

The adjusting section 18 subsequently subtracts the erroneous offset measured in step S31 from each of the correction data for the correction target bits measured in step S32. Then, the adjusting section 18 sets each of the correction data for bits obtained by subtracting the erroneous offset in the correction data output section 32 of the first A/D conversion section 12-1 (S33). As an example, the adjusting section 18 may write the correction data for bits obtained by removing the erroneous offset into the memory 72 in the correction data output section 32 of the first A/D conversion section 12-1. According to the processes of the above-described steps S31 to S33, the adjusting section 18 can output from the correction data output section 32 correction data by which the erroneous offset of the comparing section 22 in the first A/D conversion section 12-1 and the linearity error of the D/A converter 20 is offset.

Next, the adjusting section 18 sequentially selects one by one from the second A/D conversion section 12-2 to the fourth A/D conversion section 12-4, and executes each process of the following steps S35 to S39 in the A/D conversion section 12 that is selected for adjustment (S34 and S40).

Hereinafter, it is assumed that the A/D conversion section 12 for adjustment is the Mth A/D conversion section 12-M (M is an integer number corresponding to two or more). It is assumed that the adjusted A/D conversion section 12, which is selected as an adjustment target just before the A/D conversion section 12 for adjustment, is the (M−1)th A/D conversion section 12-(M−1). It is assumed that the switch between output terminals 16 provided between the (M−1)th A/D conversion section 12-(M−1) and the Mth A/D conversion section 12-M is the (M−1)th switch 16-(M−1) between output terminals.

First, the adjusting section 18 measures an erroneous offset of the comparing section 22 in the Mth A/D conversion section 12-M (S35). A method for measuring an erroneous offset of the comparing section 22 of the Mth A/D conversion section 12-M in the present step S35 is similar to a method for measuring an erroneous offset of the comparing section 22 of the first A/D conversion section 12-1 in step S31, which is described in detail with reference to FIG. 10.

The adjusting section 18 subsequently turns on the (M−1)th switch 16-(M−1) between output terminals (S36). Next, the adjusting section 18 measures an erroneous offset of the comparing section 22 of the Mth A/D conversion section 12-M in a state that the (M−1)th switch 16-(M−1) between output terminals is turned on (S37). The erroneous offset of the comparing section 22 is changed in accordance with a capacity connected to the input port of the comparing section 22. Therefore, when the (M−1)th switch 16-(M−1) between output terminals is turned on, the erroneous offset of the comparing section 22 of the M-th A/D conversion section 12-M is different from the erroneous offset measured in step S35. A method for measuring the erroneous offset in the present step S37 is similar to a method for measuring the erroneous offset of the comparing section 22 of the first A/D conversion section 12-1 in step S31, which is described in detail in FIG. 10.

The adjusting section 18 subsequently turns on the (M−1)th switch 16-(M−1) between output terminals, and measures correction data for each of the correction target bits in the D/A converter 20 of the Mth A/D conversion section 12-M (S38). In addition, a method for measuring the correction data for bits of the D/A converter 20 of the Mth A/D conversion section 12-M in step S38 will be described in detail with reference to FIG. 12.

The adjusting section 18 subsequently subtracts the erroneous offset measured in S35 and the erroneous offset measured in step S37 from each of the correction data for the correction target bits measured in step S38.

Then, the adjusting section 18 sets each of the correction data for bits obtained by subtracting the erroneous offsets in the correction data output section 32 of the Mth A/D conversion section 12-M (S39). As an example, the adjusting section 18 may write the correction data for bits obtained by removing the erroneous offset into the memory 72 of the correction data output section 32 of the M-th A/D conversion section 12-M. By the processes of the above steps S35 to S39, the adjusting section 18 can output from the correction data output section 32 correction data by which input and output characteristics of the D/A converter 20 of the Mth A/D conversion section 12-M can be matched with input and output characteristics of the D/A converter 20 of the (M−1)th A/D conversion section 12-(M−1).

Figure 10:
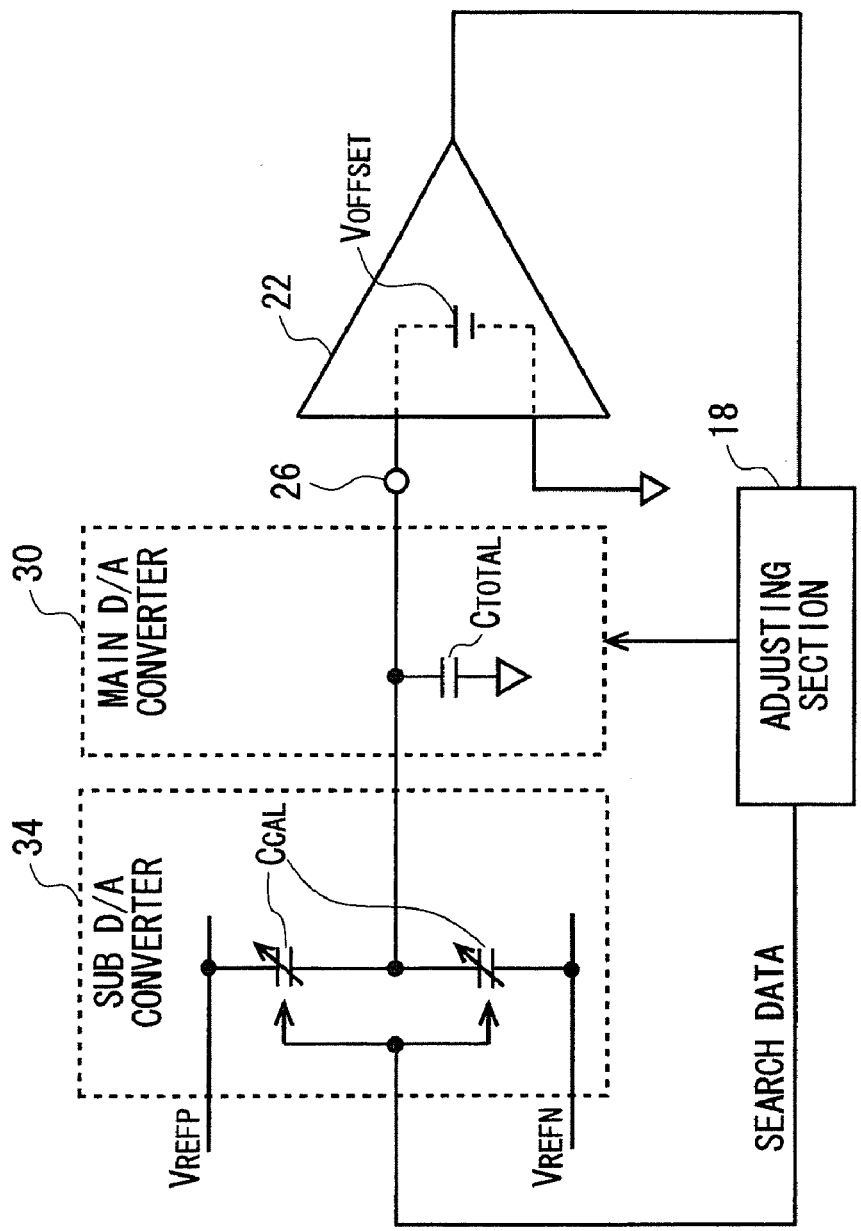
FIG. 10 shows a control example when measuring an erroneous offset of a comparing section 22 in a first A/D conversion section 12-1, in step S31 of FIG. 9.

FIG. 10 shows a control example when measuring an erroneous offset of the comparing section 22 in the first A/D conversion section 12-1, in step S31 of FIG. 9. In addition, FIG. 10 shows a connection example when measuring an erroneous offset of the comparing section 22 in the M-th A/D conversion section 12-M, in steps S35 and S37 of FIG. 9.

When measuring the erroneous offset of the comparing section 22, the adjusting section 18 sets the main D/A converter 30 so that the other ends of the plurality of bit capacitors 54 are connected to the standard potential. As a result, the main D/A converter 30 applies the standard potential to the output terminal 26.

In a state that the main D/A converter 30 is set as described above, the adjusting section 18 subsequently gives search data in place of correction data to the sub D/A converter 34. The adjusting section 18 changes the search data, and detects search data at which the output voltage of the output terminal 26 is identical to the offset voltage $V_{OFFSET}$, on the basis of the results compared by the comparing section 22 in each value of the changed search data.

At this time, the comparing section 22 ideally outputs a result obtained by comparing the output voltage of the output terminal 26 and the standard potential. However, the comparing section 22 really outputs a result obtained by comparing the output voltage of the output terminal 26 and the voltage obtained by adding the erroneous offset $V_{OFFSET}$ to the reference voltage. Therefore, the search data detected in this way is equal to the result obtained by converting the erroneous offset voltage $V_{OFFSET}$ of the comparing section 22 from analog to digital by means of the sub D/A converter 34. For this reason, the adjusting section 18 can acquire data expressing an erroneous offset of the comparing section 22 by detecting search data in this way.

In this case, the adjusting section 18 may switch a positive reference potential $V_{REFP}$ and a negative reference potential $V_{REFN}$, which is symmetric against the positive reference potential $V_{REFP}$ while holding the standard potential between the negative and positive reference potentials, as a reference potential given to the sub D/A converter 34. In this way, the adjusting section 18 can measure the positive erroneous offset and the negative erroneous offset voltage for the standard potential.

Figure 11:
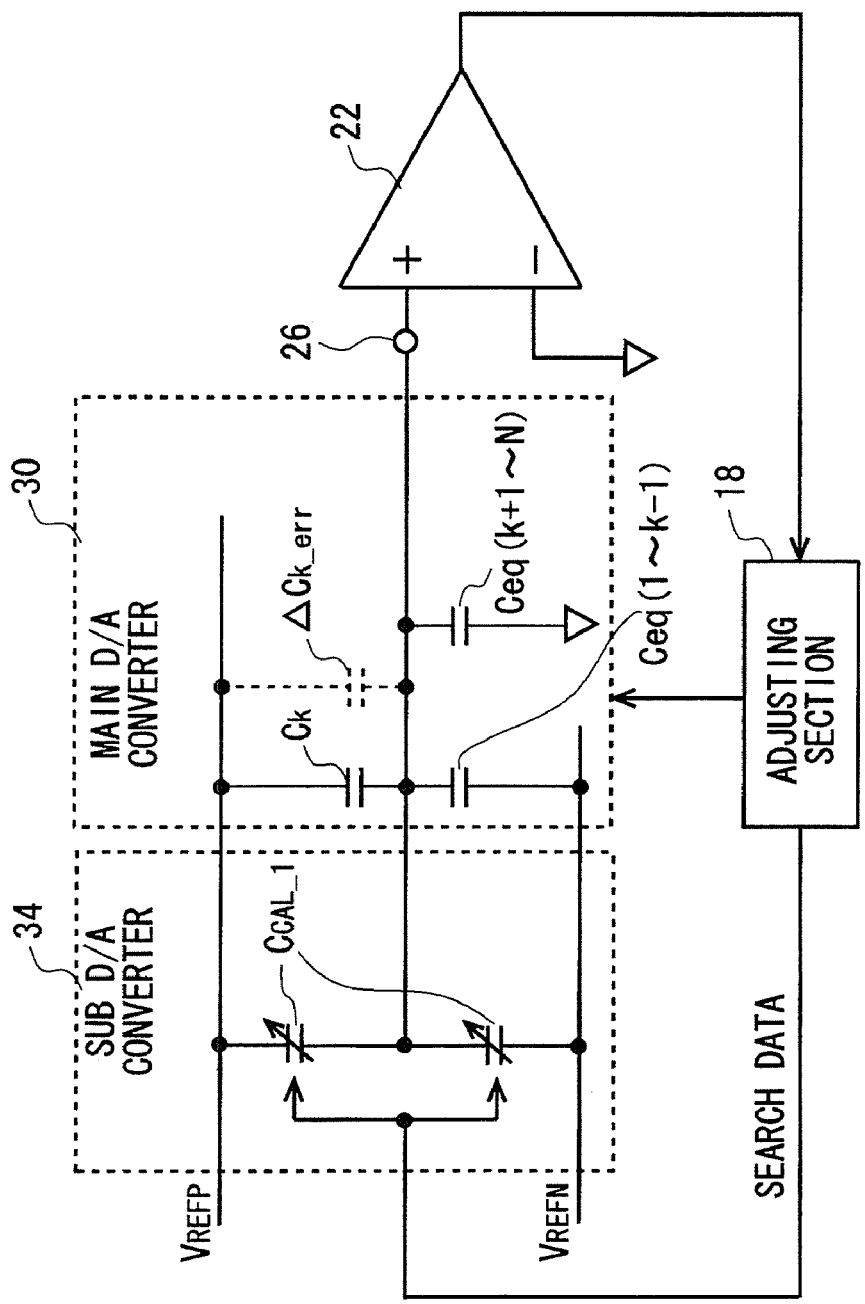
FIG. 11 shows a control example when measuring correction data for each bit corresponding to one correction target bit in a D/A converter 20 of the first A/D conversion section 12-1, in step S32 of FIG. 9.

FIG. 11 shows a control example when measuring correction data for each bit corresponding to one correction target bit for the D/A converter 20 in the first A/D conversion section 12-1, in step S32 of FIG. 9. When measuring the correction data for bits corresponding to one correction target bit (the kth bit from the low order) in the D/A converter 20 of the first A/D conversion section 12-1, the adjusting section 18 sets the main D/A converter 30 of the D/A converter 20 in the first A/D conversion section 12-1 as described below.

In other words, the adjusting section 18 connects the other ends of the bit capacitors 54 corresponding to the lower-order bits (1st to (k−1)th bits from the low order) than the one correction target bit to the negative reference potential $V_{REFN}$. The adjusting section 18 connects the other end of the bit capacitors 54 corresponding to the one correction target bit (the kth bit from the low order) to the positive reference potential $V_{REFP}$. The adjusting section 18 connects the other ends of the bit capacitors 54 corresponding to the higher-order bits (the (k+1)th to Nth bits from the low order) than the one correction target bit to the standard potential.

A capacity (Ck) allotted to one correction target bit (the kth bit) is ideally equal to a composite capacity (Ceq(1 to k−1)) of capacities allotted to lower-order bits than the one correction target bit (the kth bit). Therefore, as a result set in this manner, the main D/A converter 30 ideally applies the standard potential to the output terminal 26.

However, the capacity (Ck) allotted to the one correction target bit (the kth bit) includes an error capacity (ΔCk_err). Therefore, as a result set in this manner, the main D/A converter 30 really applies to the output terminal 26 a voltage that is obtained by deviating an electric potential according to the error capacity (ΔCk_err) from the standard potential.

Therefore, in a state that the main D/A converter 30 is set as described above, the adjusting section 18 gives search data in place of correction data to the sub D/A converter 34. Then, the adjusting section 18 changes the search data, and detects search data at which the output voltage of the output terminal 26 is identical to the standard potential, on the basis of the results compared by the comparing section 22 in each value of the changed search data.

The search data detected in this way is equal to a result obtained by converting a voltage according to an error capacity (ΔCk_err) of one correction target bit from analog to digital by means of the sub D/A converter 34. Therefore, the adjusting section 18 determines the correction data for bits corresponding to one correction target bit on the basis of the search data detected in this manner. As an example, the adjusting section 18 uses data, by which a correction voltage offsetting a voltage according to an error capacity (ΔCk_err) of one correction target bit is outputted from the sub D/A converter 34, as the correction data for bits corresponding to one correction target bit.

In this case, the adjusting section 18 may switch the positive reference potential $V_{REFP}$ and the negative reference potential $V_{REFN}$ as the reference potential given to the sub D/A converter 34. In this way, when the capacity Ck allotted to the kth bit is larger than an ideal value and is smaller than the ideal value, the adjusting section 18 can measure the output voltage of the output terminal 26.

Figure 12:
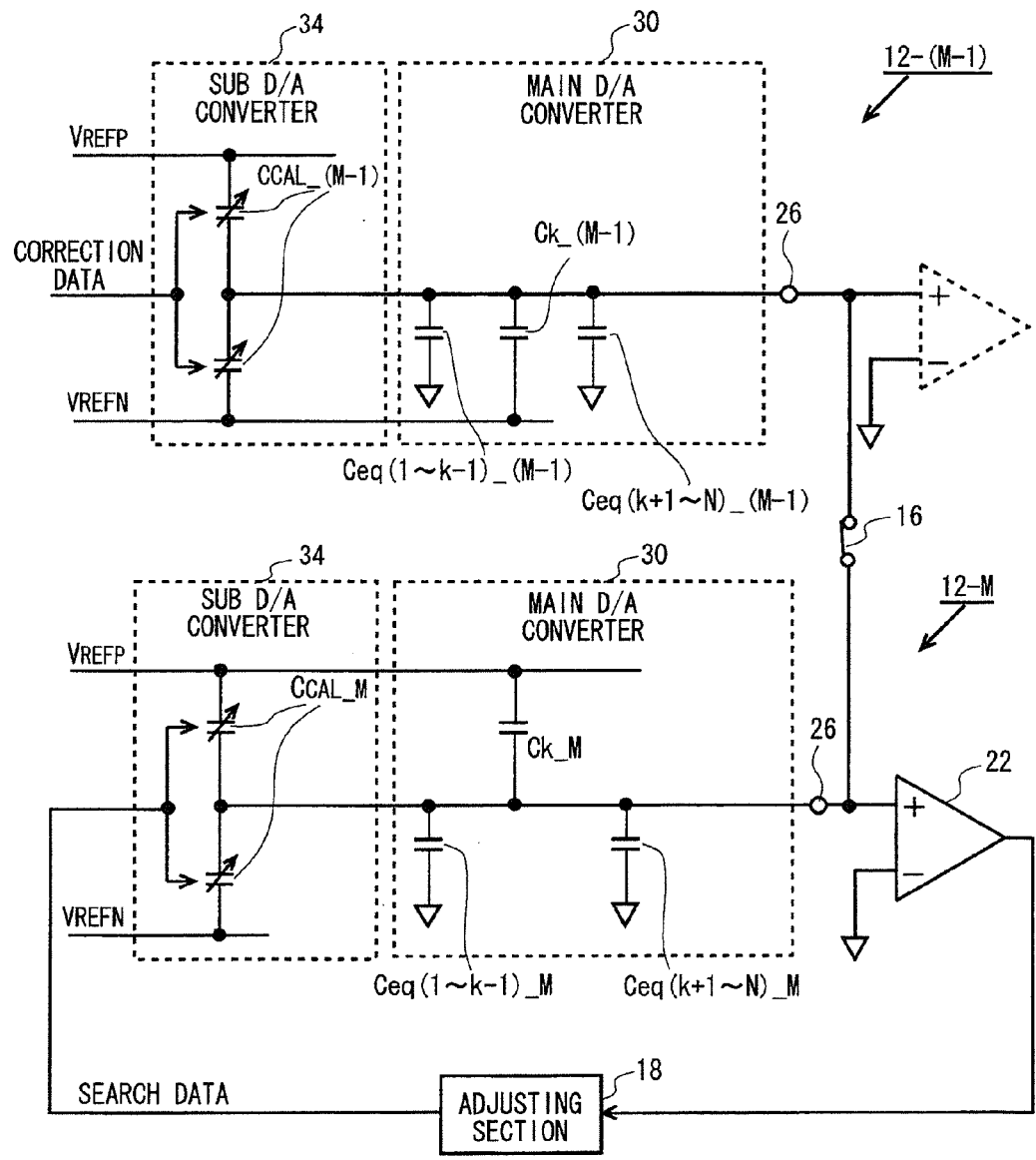
FIG. 12 shows a control example when measuring correction data for each bit corresponding to one correction target bit in the D/A converter 20 of a second A/D conversion section 12-2 in a state that a first switch 16-1 between output terminals is turned on, in step S38 of FIG. 9.

FIG. 12 shows a control example when measuring correction data for each bit corresponding to one correction target bit in the D/A converter 20 of the second A/D conversion section 12-2 in a state that the first switch 16-1 between output terminals is turned on, in step S38 of FIG. 9. When the first switch 16-1 between output terminals is turned on and the correction data for bits corresponding to one correction target bit (the kth bit from the low order) are measured in the D/A converter 20 of the second A/D conversion section 12-2, the adjusting section 18 sets the main D/A converter 30 of the D/A converter 20 of the first A/D conversion section 12-1 as described below.

In other words, the adjusting section 18 connects the other ends of the bit capacitors 54 corresponding to low-order bits (the 1st to (k−1)th bits from the low order) than one correction target bit to the standard potential, in the main D/A converter 30 of the first A/D conversion section 12-1. The adjusting section 18 connects the other end of the bit capacitor 54 corresponding to one correction target bit (the kth bit from the low order) to the negative reference potential $V_{REFN}$, in the main D/A converter 30 of the first A/D conversion section 12-1. The adjusting section 18 connects the other ends of the bit capacitors 54 corresponding to higher-order bits (the (k+1)th to Nth bits from the low order) than one correction target bit to the standard potential, in the main D/A converter 30 of the first A/D conversion section 12-1.

The adjusting section 18 further gives the correction data for bits corresponding to the kth bit measured in the main D/A converter 30 of the first A/D conversion section 12-1 to the sub D/A converter 34 of the D/A converter 20 of the first A/D conversion section 12-1. In this way, the adjusting section 18 can correct the capacity of the bit capacitor 54 of the correction target bit (the kth bit) in the main D/A converter 30 of the first A/D conversion section 12-1 to a predetermined value.

The adjusting section 18 further sets the main D/A converter 30 of the D/A converter 20 of the second A/D conversion section 12-2 as described below. In other words, the adjusting section 18 connects to the standard potential the other ends of the bit capacitors 54 corresponding to lower-order bits (the 1st to (k−1)th bits from the low order) than one correction target bit, in the main D/A converter 30 of the second A/D conversion section 12-2. The adjusting section 18 connects to the positive reference potential $V_{REFP}$ the other end of the bit capacitor 54 corresponding to one correction target bit (the kth bit from the low order), in the main D/A converter 30 of the second A/D conversion section 12-2. The adjusting section 18 connects to the standard potential the other ends of the bit capacitors 54 corresponding to higher-order bits (the (k+1)th to Nth bits from the low order) than one correction target bit, in the main D/A converter 30 of the second A/D conversion section 12-2.

In a state set as described above, the adjusting section 18 give search data in place of correction data to the sub D/A converter 34 of the D/A converter 20 of the second A/D conversion section 12-2. Then, the adjusting section 18 changes the search data, and detects search data at which the standard potential is identical to the output voltage of the output terminal 26 of the D/A converter 20 of the second A/D conversion section 12-2, on the basis of the results compared by the comparing section 22 in each value of the changed search data.

At this time, the other end of the bit capacitor 54 corresponding to one correction target bit in the main D/A converter 30 of the first A/D conversion section 12-1 is connected to the negative reference potential $V_{REFN}$, and the other end of the bit capacitor 54 corresponding to one correction target bit in the main D/A converter 30 of the second A/D conversion section 12-2 is connected to the positive reference potential $V_{REFP}$. The output terminal 26 of the D/A converter 20 of the first A/D conversion section 12-1 and the output terminal 26 of the D/A converter 20 of the second A/D conversion section 12-2 are further connected by the switch 16 between output terminals. Therefore, if the capacity of the bit capacitors 54 of one correction target bit corrected by the sub D/A converter 34 in the main D/A converter 30 of the first A/D conversion section 12-1 is the same as the capacity of the bit capacitors 54 of one correction target bit corrected by the sub D/A converter 34 in the main D/A converter 30 of the second A/D conversion section 12-2, the electric potential of the output terminal 26 of the D/A converter 20 of the second A/D conversion section 12-2 is an electric potential (that is to say, standard potential) at a midpoint potential between the negative reference potential $V_{REFN}$ and the positive reference potential $V_{REFP}$.

For this reason, the search data detected in this manner is equal to correction data by which the capacity of the bit capacitor 54 of one correction target bit corrected by the sub D/A converter 34 of the main D/A converter 30 of the second A/D conversion section 12-2 becomes equal to the capacity of the bit capacitor 54 of one correction target bit corrected by the sub D/A converter 34 of the main D/A converter 30 of the first A/D conversion section 12-1. Therefore, the adjusting section 18 determines the search data detected in this manner as the correction data for bits corresponding to one correction target bit in the D/A converter 20 of the second A/D conversion section 12-2.

In this case, the adjusting section 18 may detect search data at which the output voltage of the output terminal 26 of the D/A converter 20 of the second A/D conversion section 12-2 is identical to the standard potential, on the basis of the comparison result by the comparing section 22 of the first A/D conversion section 12-1. Alternatively, the adjusting section 18 may compute correction data on the basis of a mean or the like of the search data detected based on the comparison results by the comparing section 22 in the first A/D conversion section 12-1 and the search data detected based on the comparison results by the comparing section 22 in the second A/D conversion section 12-2.

Figure 13:
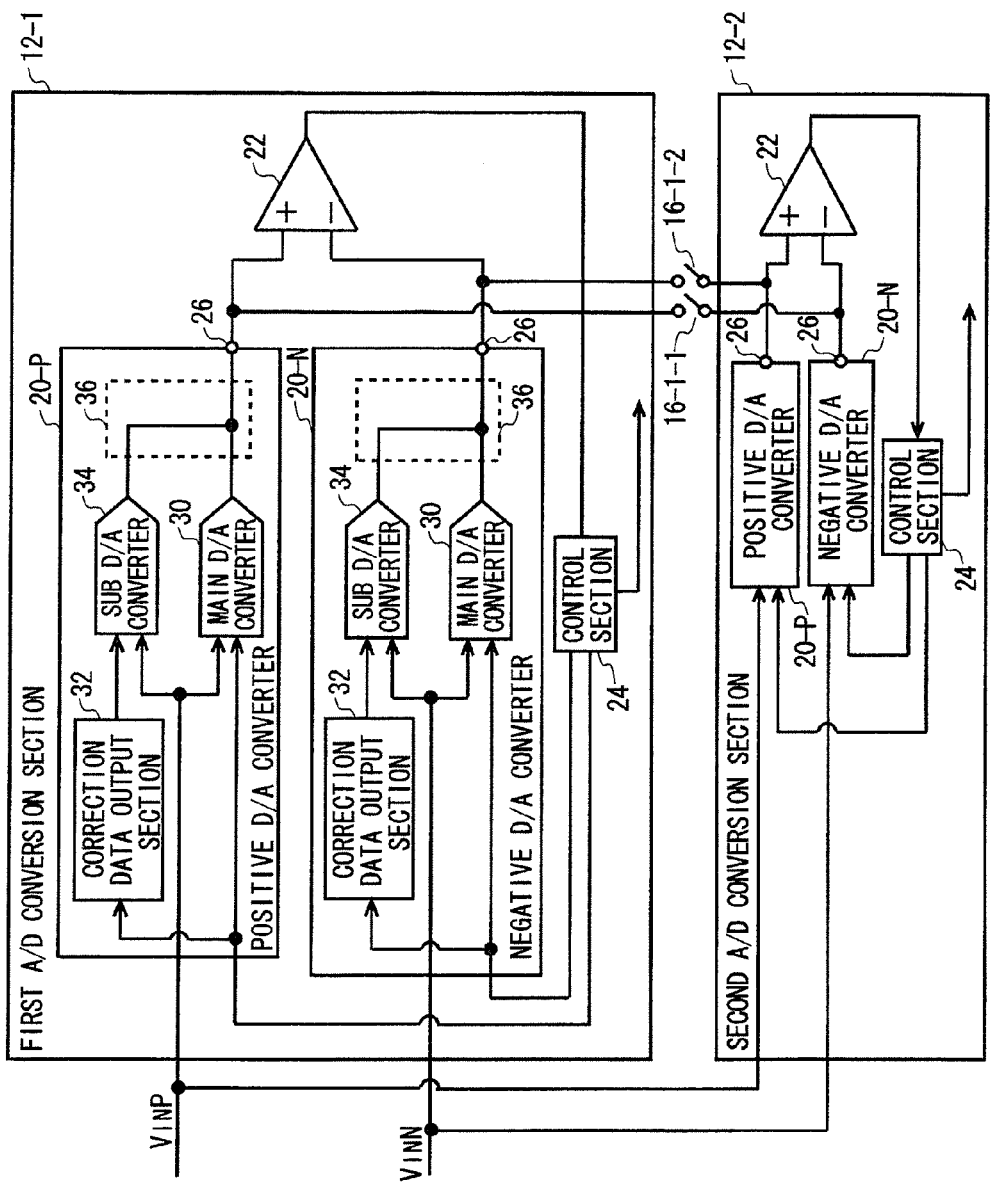
FIG. 13 shows a configuration of the first A/D conversion section 12-1 and the second A/D conversion section 12-2 included in the A/D conversion device 10 according to an alternative example of the present embodiment.

FIG. 13 shows a configuration of the first A/D conversion section 12-1 and the second A/D conversion section 12-2 included in the A/D conversion device 10 according to an alternative example of the present embodiment. Since the A/D conversion device 10 according to the present alternative example has substantially the same configuration and function as those of the A/D conversion device 10 described in FIG. 1 to FIG. 12, the same members having substantially the same configuration and function as those of the members shown in FIG. 1 to FIG. 12 have the reference numbers and their descriptions will be omitted except the following differences.

The A/D conversion device 10 according to the present alternative example includes a plurality of differential A/D conversion sections 12. In the present example, the A/D conversion device 10 includes a first A/D conversion section 12-1 and a second A/D conversion section 12-2.

Each of the A/D conversion sections 12 outputs digital output data $D_{OUT}$ according to differential analog input voltages ($V_{IN}P$ and $V_{IN}N$). Each of the differential A/D conversion sections 12 according to the present alternative example includes a positive D/A converter 20-P, a negative D/A converter 20-N, a comparing section 22, and a control section 24.

The positive D/A converter 20-P receives a positive input data, and outputs a voltage according to the positive input data. The positive D/A converter 20-P further samples a positive input voltage $V_{IN}P$ during sampling, and holds the sampled positive input voltage $V_{IN}P$ during holding. Then, according to the supply of the positive input data, the positive D/A converter 20-P outputs a positive difference voltage $V_RP$ obtained by subtracting the positive input voltage $V_{IN}P$ from the output voltage according to the positive input data during holding.

The negative D/A converter 20-N receives a negative input data, and outputs a voltage according to the negative input data. The negative D/A converter 20-N further samples the negative input voltage $V_{IN}N$ during sampling, and holds the sampled negative input voltage $V_{IN}N$ during holding. Then, according to the supply of the negative input data, the negative D/A converter 20-N outputs a negative difference voltage $V_RN$ obtained by subtracting the negative input voltage $V_{IN}N$ from the output voltage according to the negative input data during holding.

Each of the positive D/A converter 20-P and the negative D/A converter 20-N may have the same configuration as that of the D/A converter 20 shown in FIG. 2. In other words, each of the positive D/A converter 20-P and the negative D/A converter 20-N may have a main D/A converter 30, a correction data output section 32, a sub D/A converter 34, and an addition section 36.

The comparing section 22 outputs a comparison result that is obtained by comparing a voltage obtained by subtracting the positive input voltage $V_{IN}$ from the output voltage of the positive D/A converter 20 and a voltage obtained by subtracting the output voltage of the negative D/A converter 20 from the negative input voltage $V_{IN}$. In the present example, the comparing section 22 outputs a result that is obtained by comparing the output voltage outputted from the output terminal 26 of the positive D/A converter 20-P and the output voltage outputted from the output terminal 26 of the negative D/A converter 20-N.

The control section 24 gives the positive input data to the positive D/A converter 20-P. The control section 24 gives a negative input data a sign of which has the reversed sign of the positive input data to the negative D/A converter 20-N.

The control section 24 detects data values of the positive input data and the negative input data at which the output voltage of the positive D/A converter 20 is substantially identical to the output voltage of the negative D/A converter 20. That is to say, the control section 24 detects the positive input data and the negative input data at which a difference voltage between the positive input voltage $V_{IN}P$ and the negative input voltage $V_{IN}N$ is identical to a difference voltage between the positive difference voltage $V_RP$ and the negative difference voltage $V_RN$. The control section 24 outputs the detected data value as the digital output data $D_{OUT}$ according to the input voltage $V_{IN}$.

In the present example, the switch 16 between output terminals 16 selects whether the output terminal 26 of the positive D/A converter 20-P of the first A/D conversion section 12-1 is connected to the output terminal 26 of the negative D/A converter 20-N of the second A/D conversion section 12-2. The switch 16 between output terminals further selects whether the output terminal 26 of the negative D/A converter 20-N of the first A/D conversion section 12-1 is connected to the output terminal 26 of the positive D/A converter 20-P of the second A/D conversion section 12-2.

The adjusting section 18 according to the present alternative example serially connects bit capacitors of the positive D/A converter 20-P of the first A/D conversion section 12-1 to bit capacitors of the negative D/A converter 20-N of the second A/D conversion section 12-2 that correspond to the same bits. In this case, the adjusting section 18 previously discharges the bit capacitors. Initial charges accumulated by the bit capacitors become zero. Then, the adjusting section 18 adjusts a capacity of at least one of the bit capacitors so that a voltage between the two bit capacitors approaches a middle point of voltages of the two bit capacitors.

In this way, the adjusting section 18 can adjust input-output characteristics of the D/A converter 20 of the first A/D conversion section 12-1 to a predetermined characteristic. The adjusting section 18 can further match input-output characteristics of the first differential A/D conversion section 12-1 with input-output characteristics of the second differential A/D conversion section 12-2. In this way, the A/D conversion device 10 can perform a differential A/D conversion with small linearity error and with high precision.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. An A/D conversion device comprising:
   a first A/D conversion section and a second A/D conversion section that each comprise: a D/A converter that has a plurality of bit capacitors corresponding to bits of input data; a comparing section that compares a reference voltage with a difference voltage obtained by subtracting an analog input voltage from an output voltage of the D/A converter; and a control section that detects a data value of the input data at which the difference voltage is substantially the same as the reference voltage and outputs the data value as digital data according to the input voltage; and an adjusting section that serially connects the bit capacitors of the D/A converter of the first A/D conversion section and the bit capacitors of the D/A converter of the second A/D conversion section that correspond to the same bits, and adjusts a capacity of at least one of the bit capacitors so that a voltage between the two bit capacitors approaches a middle point of voltages of the two bit capacitors.

2. The A/D conversion device according to claim 1, further comprising a switch between output terminals that selects whether an output terminal to which the plurality of bit capacitors in the D/A converter of the first A/D conversion section are connected is connected to an output terminal to which the plurality of capacitors in the D/A converter of the second A/D conversion section are connected, wherein the adjusting section turns on the switch between output terminals and serially connects the bit capacitors of the D/A converter of the first A/D conversion section and the bit capacitors of the D/A converter of the second A/D conversion section that correspond to the same bits.

3. The A/D conversion device according to claim 2, wherein the D/A converter of the second A/D conversion section comprises:

a main D/A converter that has a plurality of bit capacitors corresponding to bits of input data;

a correction data output section that outputs correction data according to the input data; and a sub D/A converter that has at least one correction capacitor corresponding to bits of the correction data outputted from the correction data output section, and the adjusting section serially connects a bit capacitor of the D/A converter of the first A/D conversion section and a bit capacitor of the D/A converter of the second A/D conversion section corresponding to the same bit, a capacity of which is corrected by the correction capacitor according to the correction data, and adjusts the correction data so that a voltage between the two bit capacitors approaches a middle point of voltages of the two bit capacitors.

4. The A/D conversion device according to claim 3, wherein the adjusting section serially connects the bit capacitors of the D/A converter of the first A/D conversion section and the bit capacitors of the D/A converter of the second A/D conversion section and corrects the correction data on the basis of the comparison result between the reference voltage and a voltage between the two bit capacitors, which is outputted from the at least one comparing section of the first A/D conversion section and the second A/D conversion section.

5. The A/D conversion device according to claim 3, wherein the adjusting section serially connects the bit capacitors of the D/A converter of the first A/D conversion section and the bit capacitors of the D/A converter of the second A/D conversion section and corrects the correction data on the basis of the comparison result between the reference voltage and a voltage between the two bit capacitors, which is outputted from the comparing sections of the first A/D conversion section and the second A/D conversion section.

6. The A/D conversion device according to claim 1, wherein each of the D/A converters of the first A/D conversion section and the second A/D conversion section comprises:

a main D/A converter that has a plurality of bit capacitors corresponding to bits of input data;

a correction data output section that outputs correction data according to the input data; and a sub D/A converter that has at least one correction capacitor corresponding to bits of the correction data outputted from the correction data output section, and the adjusting section: modifies the correction data so that a voltage outputted from the D/A converter of the first A/D conversion section approaches a voltage according to the input data, in a first adjustment process for adjusting the D/A converter of the first A/D conversion section; and serially connects a bit capacitor a capacity of which is corrected by the at least one correction capacitor of the first A/D conversion section and a bit capacitor corresponding to the same bit as that of the first A/D conversion section, a capacity of which is corrected by the at least one correction capacitor of the second A/D conversion section, and adjusts the correction data outputted from the correction data output section of the second A/D conversion section so that a voltage between the two bit capacitors approaches a middle point of voltages of the two bit capacitors, in a second adjustment process for adjusting the D/A converter of the second A/D conversion section.

7. The A/D conversion device according to claim 6, further comprising a third A/D conversion section that comprises: a D/A converter that has a plurality of bit capacitors corresponding to bits of the input data; a comparing section that compares, with the reference voltage, a difference voltage obtained by subtracting an analog input voltage from an output voltage of the D/A converter; and a control section that detects a data value of the input data at which the difference voltage is substantially the same as the reference voltage and outputs the data value as digital data according to the input voltage, wherein the adjusting section serially connects a bit capacitor a capacity of which is corrected by the at least one correction capacitor of the second A/D conversion section and a bit capacitor corresponding to the same bit as that of the second A/D conversion section, a capacity of which is corrected by the at least one correction capacitor of the third A/D conversion section, and adjusts the correction data outputted from the correction data output section of the third A/D conversion section so that a voltage between the two bit capacitors approaches a middle point of voltages of the two bit capacitors, in a third adjustment process for adjusting the D/A converter of the third A/D conversion section after the second adjustment process.

8. The A/D conversion device according to claim 1, wherein the first A/D conversion section and the second A/D conversion section interleave the input voltage, convert the interleaved voltage from analog to digital, and output the converted voltage as digital data.

9. An A/D conversion device comprising:

a first A/D conversion section and a second A/D conversion section that each comprise: positive and negative D/A converters that have a plurality of bit capacitors corresponding to bits of input data; a comparing section that compares a voltage obtained by subtracting a positive input voltage from an output voltage of the positive D/A converter and a voltage obtained by subtracting an output voltage of the negative D/A converter from a negative input voltage; and a control section that detects a data value of the input data at which the output voltages outputted from the positive D/A converter and the negative D/A converter are substantially the same as each other and outputs the data value as digital data according to the input voltage; and an adjusting section that serially connects the bit capacitors of the positive D/A converter of the first A/D conversion section and the bit capacitors of the negative D/A converter of the second A/D conversion section that correspond to the same bit, and adjusts a capacity of at least one of the bit capacitors so that a voltage between the two bit capacitors approaches a middle point of voltages of the two bit capacitors.

10. A D/A conversion device comprising:

a first D/A converter and a second D/A converter that have a plurality of bit capacitors corresponding to bits of input data; and an adjusting section that serially connects the bit capacitors of the first D/A converter and the bit capacitors of the second D/A converter that correspond to the same bits and adjusts a capacity of at least one of the bit capacitors so that a voltage between the two bit capacitors approaches a middle point of voltages of the two bit capacitors.

11. An adjusting method for an A/D conversion device comprising a first A/D conversion section and a second A/D conversion section that each comprise: a D/A converter that has a plurality of bit capacitors corresponding to bits of input data; a comparing section that compares a reference voltage with a difference voltage obtained by subtracting an analog input voltage from an output voltage of the D/A converter; and a control section that detects a data value of the input data at which the difference voltage is substantially the same as the reference voltage and outputs the data value as digital data according to the input voltage, the method comprising serially connecting the bit capacitors of the D/A converter of the first A/D conversion section and the bit capacitors of the D/A converter of the second A/D conversion section that correspond to the same bits, and adjusting an electric capacity of at least one of the bit capacitors so that a voltage between the two bit capacitors approaches a middle point of voltages of the two bit capacitors.

\* \* \* \* \*

UNITED STATES PATENT AND TRADEMARK OFFICE
CERTIFICATE OF CORRECTION

PATENT NO. : 7,755,521 B1  
APPLICATION NO. : 12/342078  
DATED : July 13, 2010  
INVENTOR(S) : Yasuhide Kuramochi et al.

Page 1 of 1

It is certified that error appears in the above-identified patent and that said Letters Patent is hereby corrected as shown below:

On the title page item (73) Assignees should read:

ADVANTEST CORPORATION, Tokyo (JP)  
Tokyo Institute of Technology, Tokyo (JP)

Signed and Sealed this  
Twenty-eighth Day of December, 2010

David J. Kappos  
*Director of the United States Patent and Trademark Office*